US008179569B2

(12) United States Patent
Kageyama et al.

(10) Patent No.: US 8,179,569 B2
(45) Date of Patent: May 15, 2012

(54) IMAGE FORMING APPARATUS

(75) Inventors: Hideo Kageyama, Saitama (JP); Hajime Misumi, Saitama (JP); Fujio Osawa, Saitama (JP); Mitsunori Shioi, Saitama (JP); Takashi Kubo, Saitama (JP); Susumu Takagaki, Saitama (JP); Yuji Sato, Saitama (JP); Kanou Saitou, Saitama (JP); Tadakazu Tsutehira, Saitama (JP)

(73) Assignee: Fuji Xerox Co., Ltd., Tokyo (JP)

( * ) Notice: Subject to any disclaimer, the term of this patent is extended or adjusted under 35 U.S.C. 154(b) by 388 days.

(21) Appl. No.: 12/552,729

(22) Filed: Sep. 2, 2009

(65) Prior Publication Data

US 2010/0238465 A1 Sep. 23, 2010

(30) Foreign Application Priority Data

Mar. 19, 2009 (JP) ................................ 2009-068348

(51) Int. Cl.

*H04N 1/40* (2006.01)
*H04N 1/46* (2006.01)
*H04N 1/00* (2006.01)
*G03F 3/08* (2006.01)
*G03G 15/00* (2006.01)

(52) U.S. Cl. .......... 358/1.9; 358/3.1; 358/504; 358/518; 358/406; 399/49; 399/74

(58) Field of Classification Search .................... 399/49, 399/41, 299; 250/339.11, 341.8
See application file for complete search history.

(56) References Cited

U.S. PATENT DOCUMENTS

| | | | | |
|---|---|---|---|---|
| 5,448,429 | A * | 9/1995 | Cribbs et al. | 360/66 |
| 6,434,347 | B2 * | 8/2002 | Nakayasu | 399/49 |
| 7,132,068 | B2 * | 11/2006 | Hakoda et al. | 264/40.1 |
| 7,379,211 | B2 * | 5/2008 | Ishii et al. | 358/3.03 |
| 2002/0001477 | A1 | 1/2002 | Nakayasu | |
| 2007/0236760 | A1 * | 10/2007 | Oki | 358/519 |

FOREIGN PATENT DOCUMENTS

| | | |
|---|---|---|
| JP | A-59-214055 | 12/1984 |
| JP | A-6-253151 | 9/1994 |
| JP | A-2002-23458 | 1/2002 |
| JP | A-2007-148080 | 6/2007 |
| JP | A-2007-241079 | 9/2007 |

OTHER PUBLICATIONS

Japanese Office Action dated Jan. 27, 2011 issued in Japanese Patent Application No. 2009-068348 (with translation).

* cited by examiner

*Primary Examiner* — King Poon
*Assistant Examiner* — Akwasi M Sarong
(74) *Attorney, Agent, or Firm* — Oliff & Berridge, PLC

(57) ABSTRACT

An image forming apparatus includes image forming sections that forms images of different colors, respectively, a correction image formation controlling section that forms correction images of the respective colors, a density sensor that detects a density of each of the correction images in synchronization with passage of each correction image on an image carrying body, a detecting section that detects a position and the density of each of the correction images, based on a binary signal of a density detection output of each of the correction images, a density correction controlling section that corrects and controls an image density of the color, based on the detected density of each of the correction images, and a color deviation correction controlling section that corrects and controls the color deviation, based on the detected position of each of the correction images.

11 Claims, 18 Drawing Sheets

IMAGE FORMING APPARATUS

CROSS-REFERENCE TO RELATED APPLICATIONS

This application is based on and claims priority under 35 U.S.C. 119 from Japanese Patent Application No. 2009-68348, filed on Mar. 19, 2009.

BACKGROUND

Technical Field

The present disclosure relates to an image forming apparatus.

SUMMARY

According to an aspect of the present invention, an image forming apparatus includes a plurality of image forming sections, a correction image formation controlling section, a density sensor, a detecting section, a density correction controlling section, and a color deviation correction controlling section. The image forming sections forms images of different colors, respectively. The correction image formation controlling section forms correction images, for density correction and color deviation correction, of the respective colors, by causing the image forming sections to draw the correction images and transferring the correction images onto an image carrying body. The density sensor detects a density of each of the correction images in synchronization with passage of each of the correction images on the image carrying body. The detecting section detects a position and the density of each of the correction images, based on a binary signal of a density detection output of each of the correction images. The density correction controlling section corrects and controls a density of an image of a color whose density is abnormal, based on the detected density of each of the correction images. The color deviation correction controlling section corrects and controls a color deviation of an image of a color in which color deviation occurs, based on the detected position of each of the correction images.

BRIEF DESCRIPTION OF THE DRAWINGS

Exemplary embodiments of the present invention will be described in details based on the following figures, wherein.

DETAILED DESCRIPTION

Exemplary embodiments of the present invention will be now described with reference to the drawings.

Figure 1:
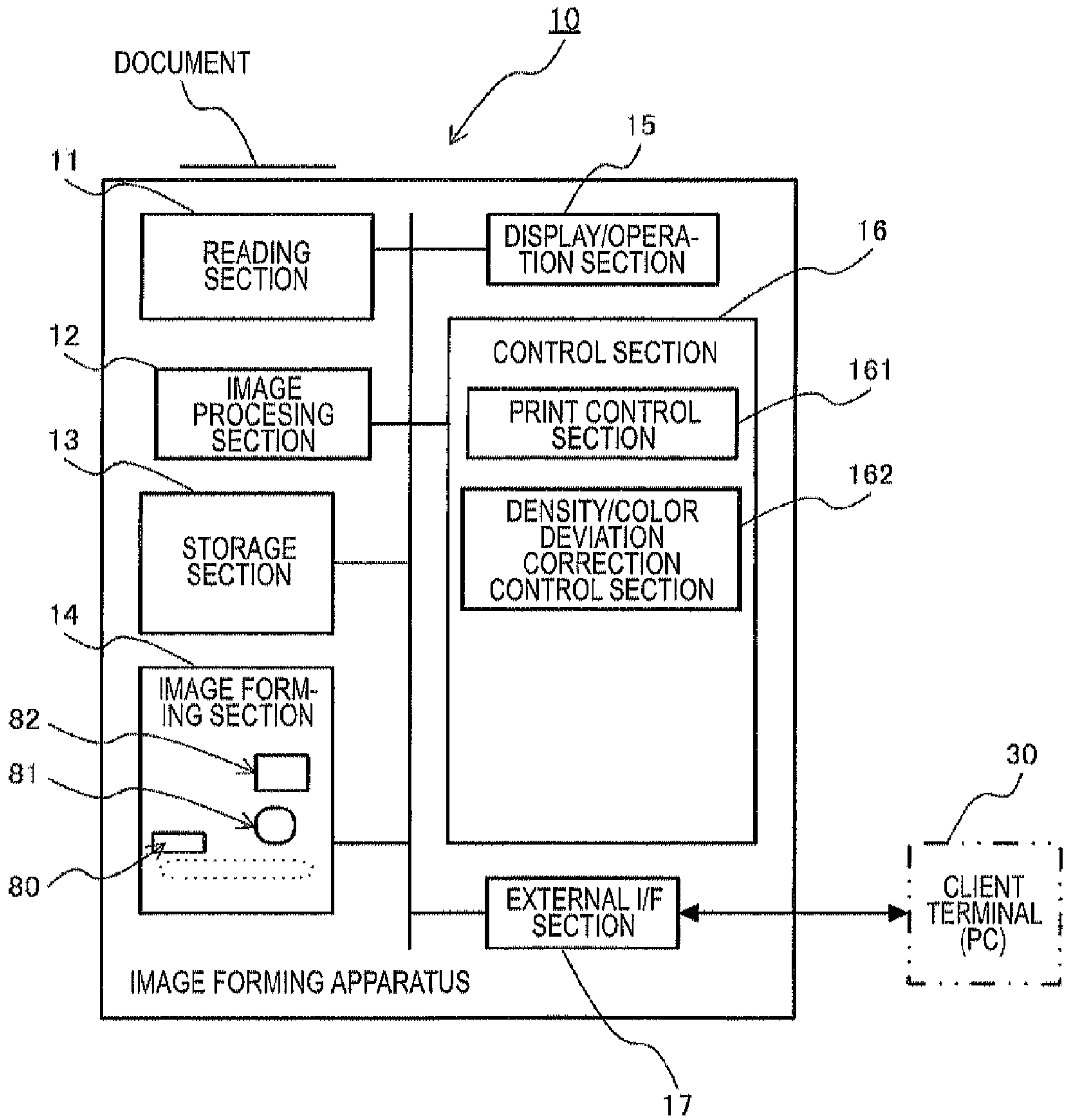
FIG. 1 is a block diagram showing a functional configuration of an image forming apparatus according to an exemplary embodiment of the present invention.

FIG. 1 is a block diagram showing a functional configuration of an image forming apparatus 10 according to the present invention.

The image forming apparatus 10 serves as a multi function machine. The image forming apparatus includes: a reading section (scanner section) 11 for reading an image of a document placed at a reading position (on a platen) and converting the image into an electric image signal (image data); an image processing section 12 for performing image processing onto image data obtained by read scan of a document performed by the reading section 11 or alternatively image data inputted from an external device (a client terminal 30 implemented by a PC in this example) such as a PC (personal computer); a storage section 13 for storing various kinds of information such as image data and operation programs; an image forming section 14 for executing an electro-photography process on the basis of the image signal (print data) having undergone the image processing in the image processing section 12 so as to form (print) an image corresponding to the print data onto a recording medium (recording paper; referred to as a printing sheet, hereinafter); a display/operation section 15 constructed from a large-sized bit-mapped display or the like provided with a touch panel function; the control section 16 for performing control of the entire apparatus like operation control of individual sections that realize the functions of document reading (scanning), copying, printing, and facsimile (FAX)

communication; and an external interface (I/F) section 17 for managing a communication interface with an external device.

In the image forming apparatus 10, the control section 16 has a control function (print control section 161) of causing the image processing section 12 to perform image processing onto image data of a document read by the reading section 11 or image data inputted through the external device through external I/F section 17 so as to generate print data (an image signal) and then causing the image forming section 14 to print and output an image onto a printing sheet on the basis the print data.

Figure 2:
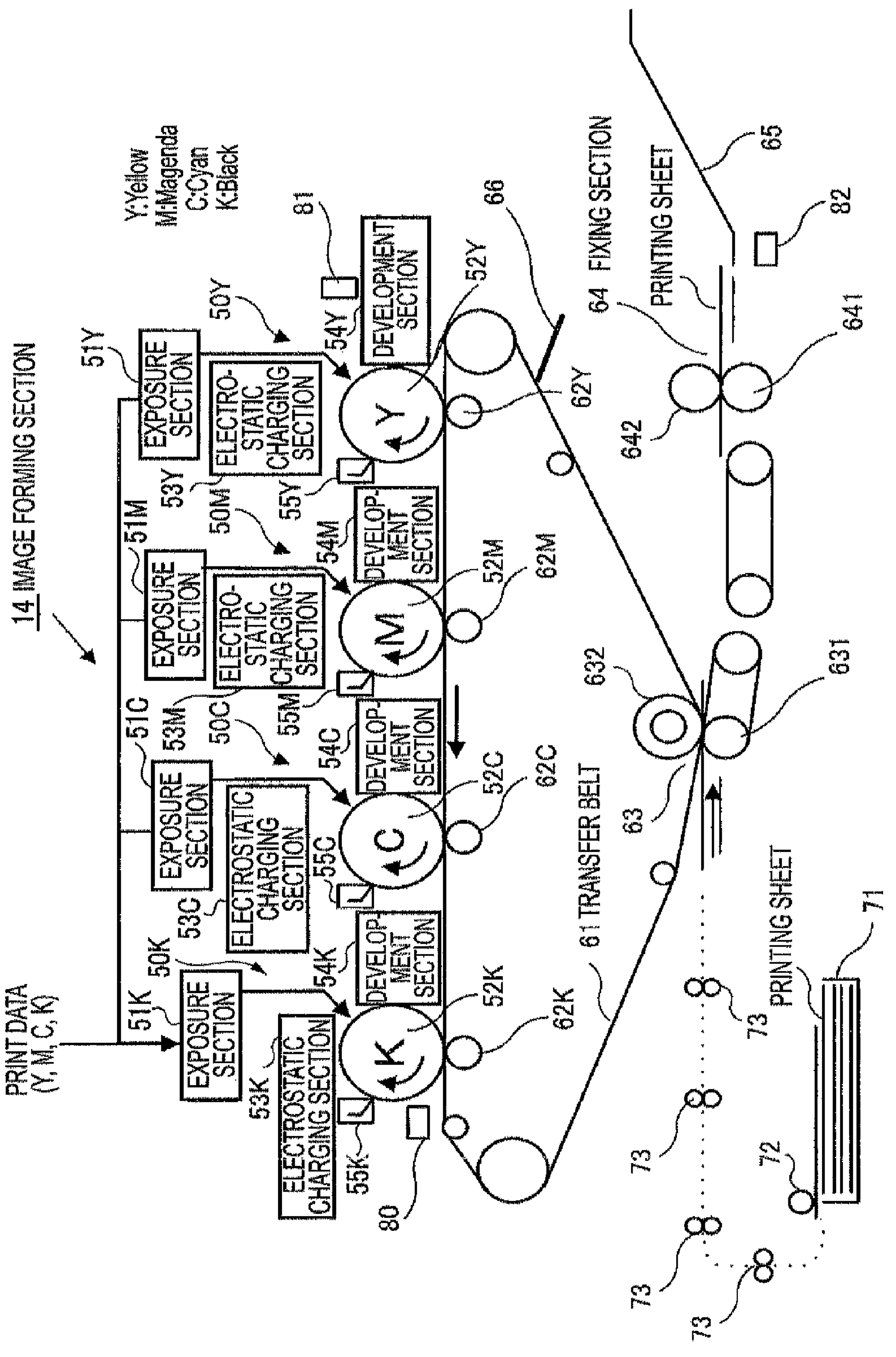
FIG. 2 is a diagram showing a configuration of an image forming section.

For example, as shown in FIG. 2, the image forming section 14 has image forming units 50Y, 50M, 50C, and 50K for forming images (toner images) of the Y color, the M color, the C color, and the K color, respectively, by using toner (Y), (M), (C), and (K) of individual colors of yellow (Y), magenta (M), cyan (C), and black (K).

Each image forming unit 50Y, 50M, 50C, or 50K has: an exposure section 51Y, 51M, 51C, or 51K for performing image exposure by using laser light on the basis of the image signal (print data) of the color component (the Y component, the M component the C component, or the K component) corresponding to each unit inputted from the image processing section 12; a photosensitive material drum 52Y, 52M, 52C, or 52K serving as an image carrying body onto which an electrostatic latent image corresponding to the image signal of each color component is formed by the above-mentioned image exposure; an electrostatic charging section 53Y, 53M, 53C, and 53K for electrostatically charging the peripheral surface of the photosensitive material drum 52Y, 52M, 52C, or 52K before the formation of the electrostatic latent image; a development section 54Y, 54M, 54C, or 54K that is filled with toner of a mutually different color (Y, M, C, or K) and that supplies toner of the color corresponding to the above-mentioned electrostatic latent image formed on the photosensitive material drum 52Y, 52M, 52C, or 52K so as to form a toner image of each color; and a drum cleaner section 55Y, 55M, 55C, or 55K for scraping residual toner on the photosensitive material drum 52Y, 52M, 52C, or 52K after the toner image of each color is transferred to a transfer belt 61 described later, so as to clean the peripheral surface of the photosensitive material drum 52Y, 52M, 52C, or 52K.

Further, the image forming section 14 has: an intermediate transfer belt (a transfer belt, hereinafter; corresponds to the image carrying body in the claims) 61 for sequentially performing multiple transfer (primary transfer) of the toner images of individual colors developed by the development sections 54Y, 54M, 54C, and 54K; belt conveying rollers 62Y, 62M, 62C, and 62K that are provided corresponding to the photosensitive material drums 52Y, 52M, 52C, and 52K of the image forming units 50Y, 50M, 50C, and 50K and that circulate and convey the transfer belt 61 in the arrow direction; a transfer section 63 for transferring (secondary transfer) the toner image generated by multiple transfer on the transfer belt 61 conveyed by the belt conveying rollers 62Y, 62M, 62C, and 62K onto a printing sheet that is sent out sheet by sheet from a sheet paper cassette 71 by a feed roller 72 and then conveyed along a paper conveyance path by plural conveying rollers 73; a fixing section 64 for allowing the printing sheet onto which the above-mentioned toner image has been transferred by the transfer section 63 to pass through in a manner of being pinched between a heating roller 641 and a pressurizing roller 642, and thereby fixing the above-mentioned toner image onto the printing sheet; a paper ejection tray 65 into which the printing sheet carrying the toner image fixed by the fixing section 64 is ejected; a cleaning blade 66 for scraping toner remained on the transfer belt 61 after the transfer (secondary transfer) performed by the transfer section 63; a density sensor 80 for detecting the density of the toner image for density correction control of each color (a density correction image) formed on the transfer belt 61 in a density correction mode described later; a temperature sensor 81 that is installed in an appropriate position near the image forming units 50Y, 50M, 50C, and 50K and that detects the temperature in the inside of the apparatus; and a printing volume counting section 82 for counting the printing volume with taking into consideration the number of printing sheets and the printing size (a size at or below A4 is counted as 1 PV. For example, A3 is counted as 2 PV).

In the image forming section 14, the transfer belt 61 is extended such as to pass between the photosensitive material drum 52Y and the belt conveying roller 62Y, between the photosensitive material drum 52M and the belt conveying roller 62M, between the photosensitive material drum 52C and the belt conveying roller 62C, between the photosensitive material drum 52K and the belt conveying roller 62K, and between a belt conveying roller 631 and a follower roller 632 that constitute the transfer section 63.

Then, at the time of ordinary print operation based on the image signal (print data) inputted from the image processing section 12, in a state that the belt conveying roller 631 of the transfer section 63 is pressed against the follower roller 632, the belt conveying rollers 62Y, 62M, 62C, 62K, and 631 are rotated so that the transfer belt 61 is revolved in the direction indicated by an arrow. In this state, the electro-photography process is performed.

In the image forming apparatus 10, in addition to the print control section 161 for executing control of forming (printing) a color image by multiple transfer of toner images of individual colors as described above, the control section 16 has a density/color deviation correction control section 162 for performing correction control for the density and the color deviation of the toner of each color as a control function for maintaining the printing quality of the color image (see FIG. 1).

Figure 3:
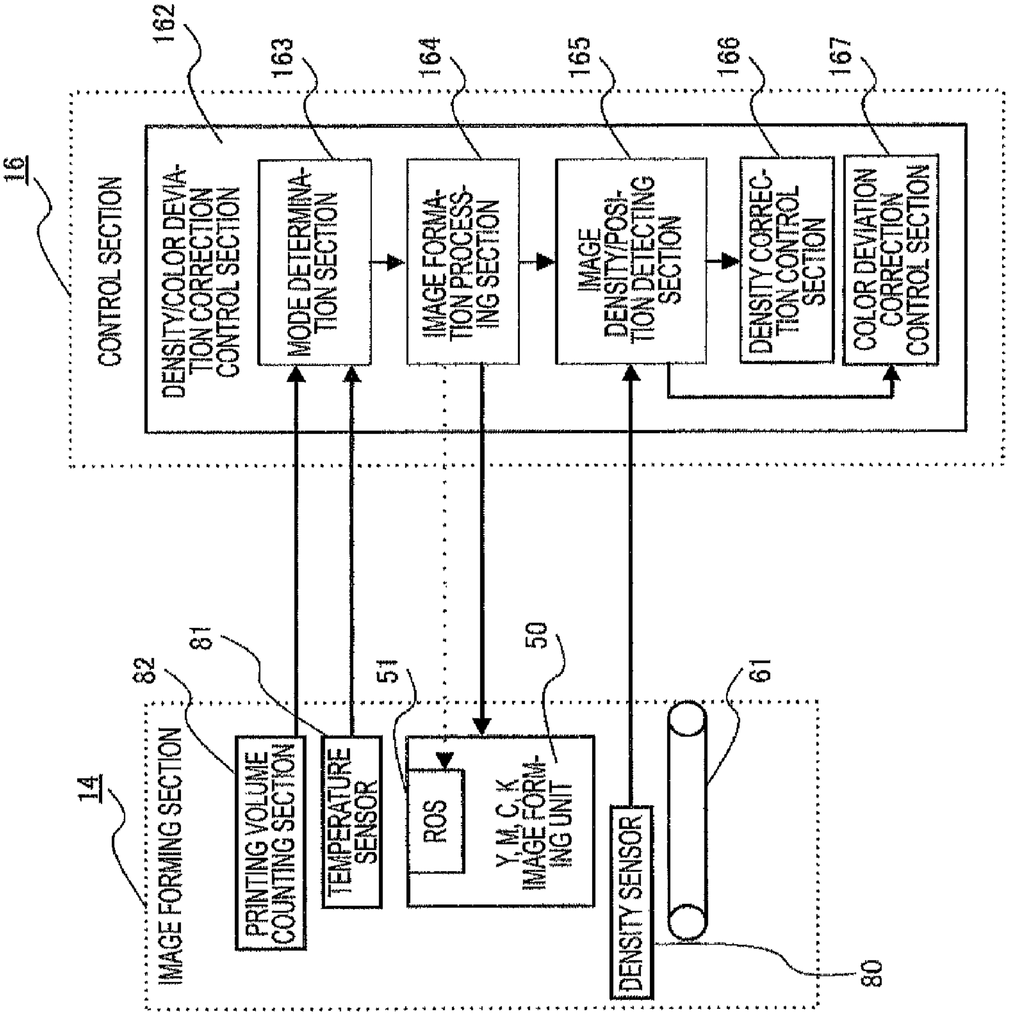
FIG. 3 is a schematic diagram showing a control system of the image forming apparatus according to the exemplary embodiment.

FIG. 3 shows a schematic configuration of a control system for realizing correction control for the density and the color deviation in the image forming apparatus 10.

According to the configuration of the control system shown in FIG. 3, the detection output of the density sensor 80 provided in the image forming section 14 is inputted to the image density/position detecting section 165 of the density/color deviation correction control section 162.

The detection output of the temperature sensor 81 in the image forming section 14 and the output of the printing volume counting section 82 are inputted to the mode determination section 163 of the density correction control section 162.

In the control section 16, when the mode determination section 163 has recognized that the temperature detected by the temperature sensor 81 and the printing volume counted by the printing volume counting section 82 satisfy the starting conditions for density/color deviation correction control, the density/color deviation correction control section 162 starts a density/color deviation correction mode. Then, the image formation processing section 164 controls the image formation processes in the image forming units 50Y, 50M, 50C, and 50K of individual colors so as to form (draw) images (density/color deviation correction images; correction patches P, hereinafter) to be shared in the density/color deviation correction control of individual colors. Then, the images are transferred onto the transfer belt 61. As a result, correction patches P of individual colors are formed to be arranged on the transfer belt 61 at predetermined intervals in the conveyance direction.

As the correction patches P, for example, color deviation correction patches may be employed that are formed on the transfer belt 61 for the purpose of color deviation correction control by an existing color image forming apparatus.

The image density/position detecting section 165 acquires the density detection output obtained by the density sensor 80 when the correction patch P of each color formed on the transfer belt 61 passes the reading position of the density sensor 80, and then detects from the density detection output the density of the correction patch P of each color and the position of the correction patch P.

The density correction control section 166 determines whether the density of the correction patch P of each color detected by the image density/position detecting section 165 is abnormal [outside a predetermined range (a low density)]. When it is determined as abnormal, the toner of the corresponding color is supplied to the toner accommodation section of the development section 54 of the image forming unit 50 of the corresponding color. As such, density correction control is performed such that the density of the toner image of the corresponding color falls within the predetermined range.

The color deviation correction control section 167 determines whether the intervals (distances) of the correction patches P of individual colors detected by the image density/position detecting section 165 deviate from a distance value (a predetermined range) set up in advance. When it is determined as deviating from the predetermined range, color deviation correction control is performed such that the amount of position deviation of the toner image of each color falls within the predetermined range, for example, by adjusting the scanning start timing of the exposure system in the exposure section 51 in the image forming unit 50 of the corresponding color.

The density/color deviation correction control in the image forming apparatus 10 according to the present invention is described below sequentially with reference to embodiments.

First Exemplary Embodiment

Figure 4:
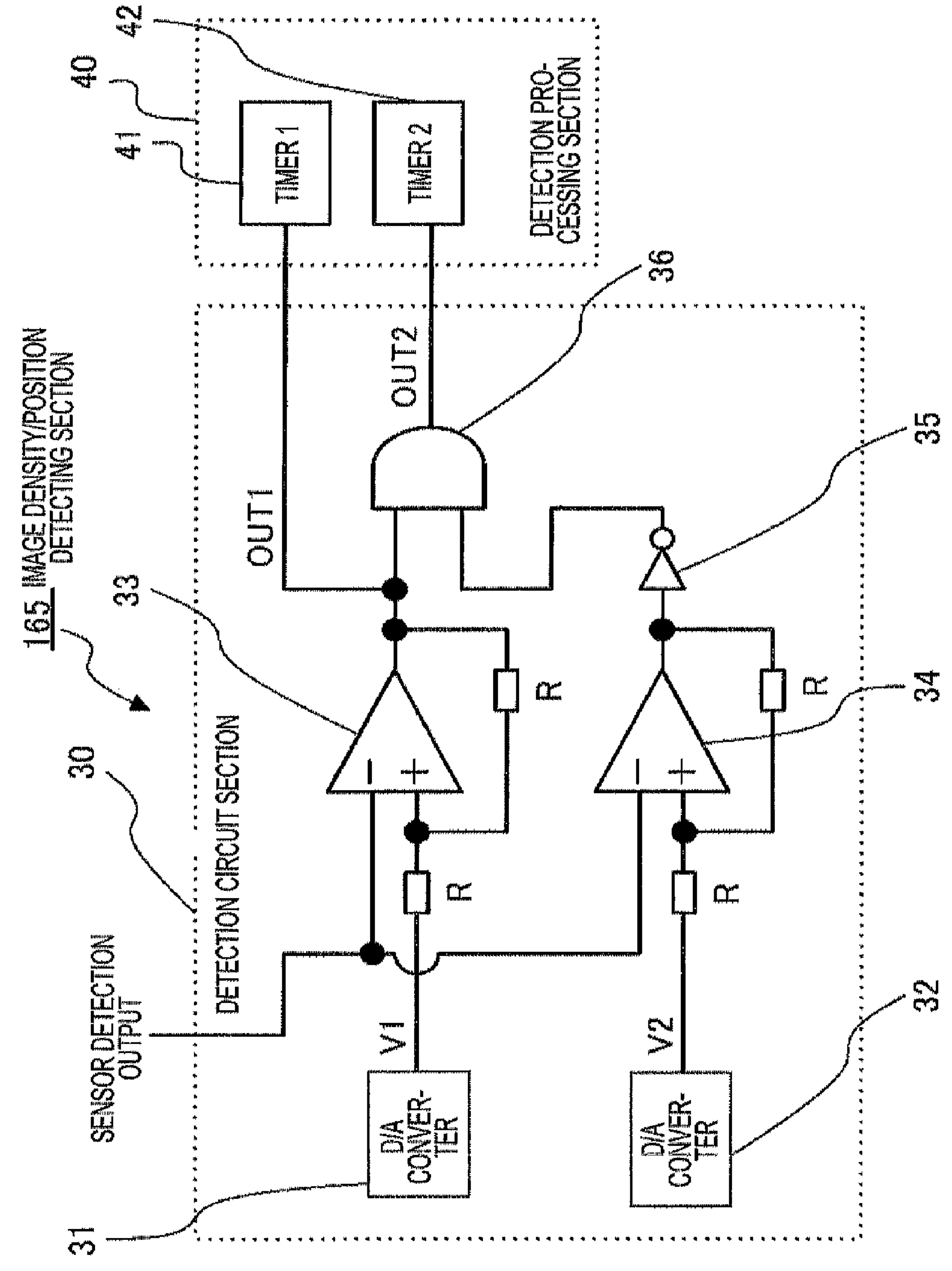
FIG. 4 is a circuit diagram showing an image density/position detecting section according to a first exemplary embodiment.

FIG. 4 is a circuit diagram showing the image density/position detecting section 165 of the image forming apparatus 10 according to a first exemplary embodiment.

The image density/position detecting section 165 has: a detection circuit section 30 provided with a digital (D)/analog (A) converter 31 for converting a digital signal corresponding to a voltage V1 into an analog signal (threshold value V1) of the value of voltage V1 and then outputting the obtained signal, a D/A converter 32 for converting a digital signal corresponding to a voltage V2 into an analog signal (threshold value V2) of the value of voltage V2 and then outputting the obtained signal, a comparator 33 for acquiring as comparison inputs the threshold voltage V1 (threshold value V1, hereinafter) outputted from the D/A converter 31 and the density detection output of the density sensor 80 [respectively through the "+" (positive) input and the "−" (negative) input] and then outputting a binary signal corresponding to the comparison result of the two inputs, a comparator 34 for acquiring as comparison inputs the threshold voltage V2 (threshold value V2, hereinafter) outputted from the D/A converter 32 and the density detection output of the density sensor 80 [respectively through the "+" (positive) input and the "−" (negative) input] and then outputting the binary signal corresponding to the comparison result of the two inputs, an inverting circuit 35 for inverting the logic level of the binary signal outputted from the comparator 34 and then outputting the obtained signal, and an AND (logical product) circuit 36 for outputting a binary signal corresponding to the logical product between the binary signal outputted from the comparator 33 and the logic inversion signal (output of the inverting circuit 35) of the binary signal outputted from the comparator 34; and a detection processing section 40 provided with a timer 41 (timer 1) for counting the time length of the output binary signal (OUT1) of the comparator 33 and a timer 42 (timer 2) for counting the time length of the output binary signal (OUT2) of the AND circuit 36.

Here, each component indicated by symbol "R" in the detection circuit section 30 indicates a resistance element provided for the purpose of imparting a hysteresis to the comparators 33 and 34 so as to achieve stable operation in the comparators 33 and 34 (unstable regions are eliminated).

Figure 5:
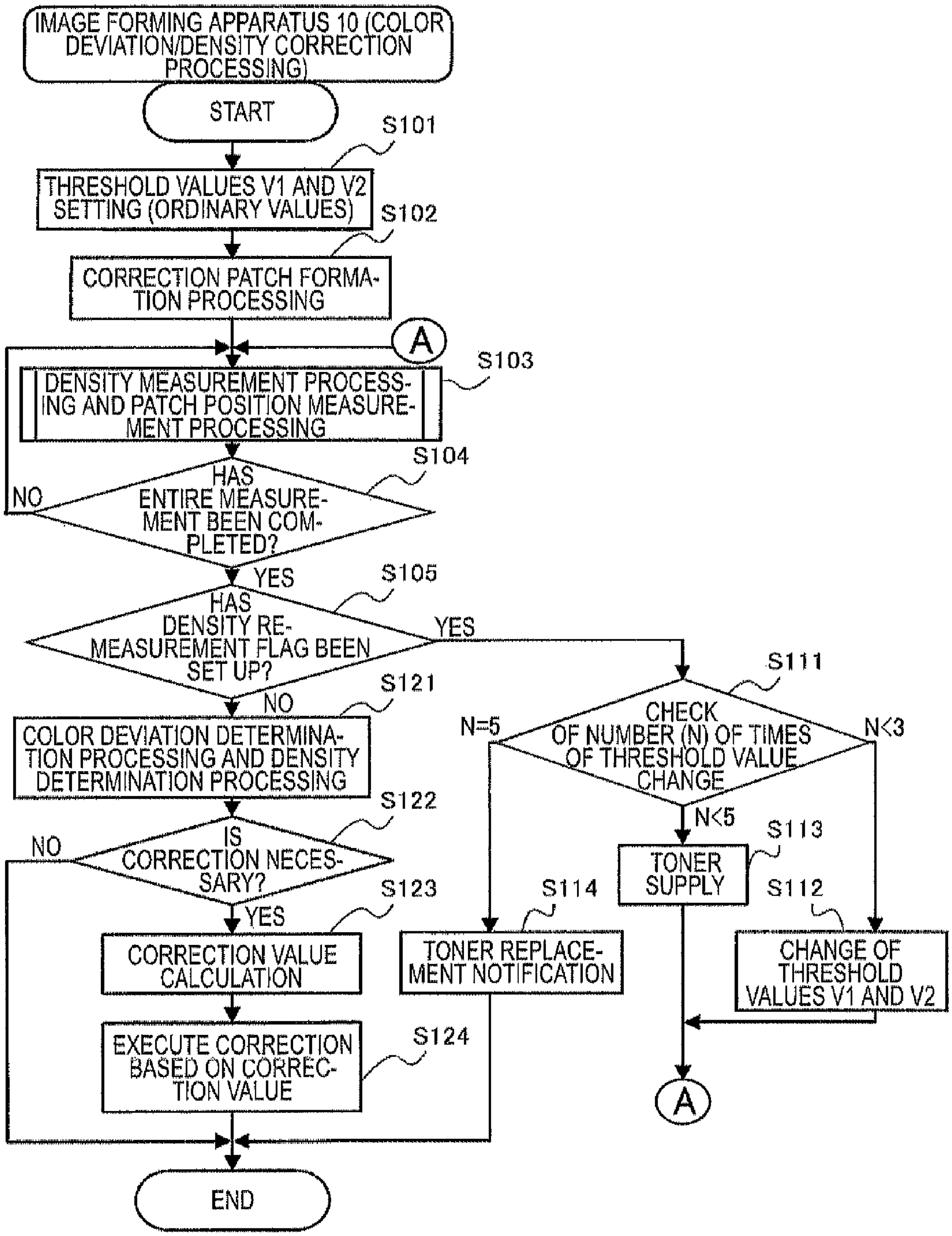
FIG. 5 is a flowchart showing density/color deviation correction processing according to the first exemplary embodiment.

FIG. 5 is a flowchart showing density/color deviation correction processing operation performed in the image forming apparatus 10 according to the exemplary embodiment In the image forming apparatus 10 according to the exemplary embodiment, when the temperature detected by the temperature sensor 81 and the printing volume detected by the printing volume counting section 82 satisfy the starting conditions (e.g., the printing volume is 100 PV and the temperature rise is 3 degrees) for the density/color deviation correction processing, the mode determination section 163 in the control section 16 starts the density/color deviation correction processing shown in FIG. 5.

As shown in FIG. 5, when the density/color deviation correction processing is started, the image density/position detecting section 165 sets up the threshold values V1 and V2 respectively for the comparators 33 and 34 in the detection circuit section 30 shown in FIG. 4 (step S101).

In the setting processing for the threshold values V1 and V2, the input digital signal to the D/A converter 31 is adjusted so that an analog signal corresponding to the threshold value V1 is outputted and then inputted to the comparator 33. On the other hand, the input digital signal to the D/A converter 32 is adjusted so that an analog signal corresponding to the threshold value V2 is outputted and then inputted to the comparator 34.

After the completion of the setting of the threshold values V1 and V2 at step S101, the image formation processing section 164 performs the processing of forming the correction patches P (step S102: correction patch formation processing).

In this correction patch formation processing, the image formation processing section 164 sequentially transmits a drawing instruction signal for the correction patch P to the image forming unit 50 (50Y, 50M, 50C, 50K) of each color at each timing corresponding to each image forming unit 50.

In the image forming unit 50 of each color, control is performed as follows. That is, on the basis of the drawing instruction signal for the correction patch P, the individual exposure section 51 performs exposure scanning of the photosensitive material drum 52 on the basis of the correction patch data of the corresponding color so as to form an electrostatic latent image. Then, the development section 54 develops the above-mentioned electrostatic latent image into a toner image (correction patch P) of the corresponding color. Then, each correction patch P is transferred onto the transfer belt 61.

Figure 6:
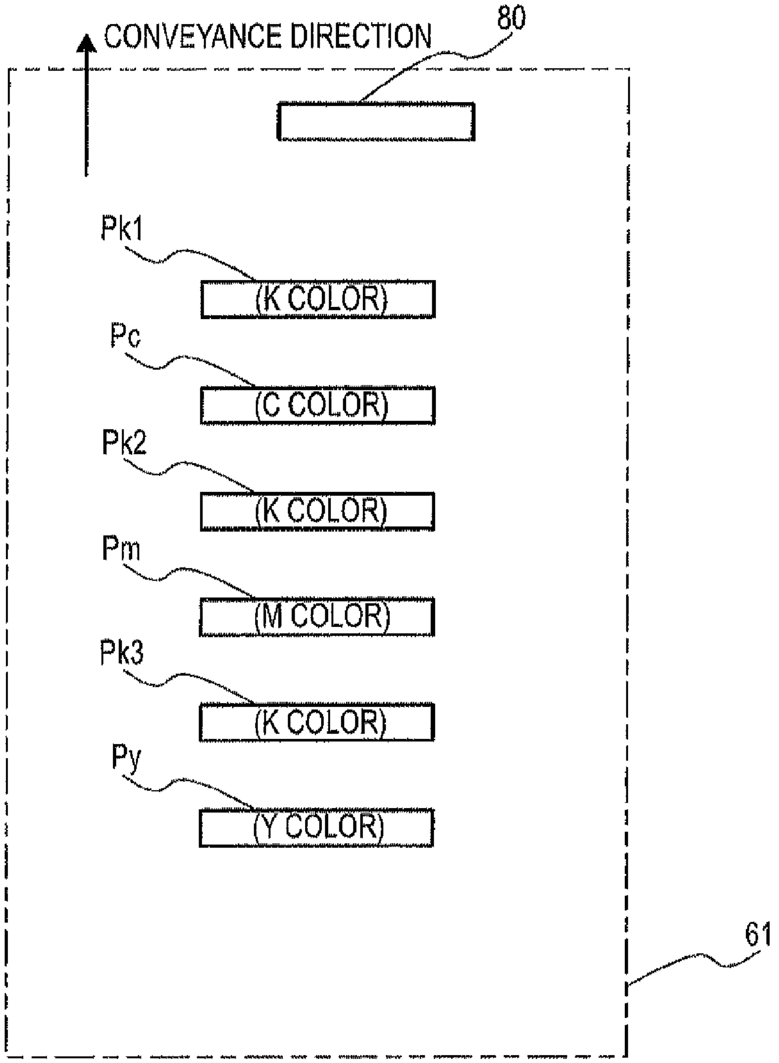
FIG. 6 is a diagram showing a mode of forming a correction patch.

As a result of the transfer process, for example, as shown in FIG. 6, the correction patch Pk1 of the K color, the correction patch Pc of the C color, the correction patch Pk2 of the K color, the correction patch Pm of the M color, the correction patch Pk3 of the K color, and the correction patch Py of the Y color arranged at predetermined distance intervals in the conveyance direction of the transfer belt 61 are formed on the transfer belt 61.

Figure 7:
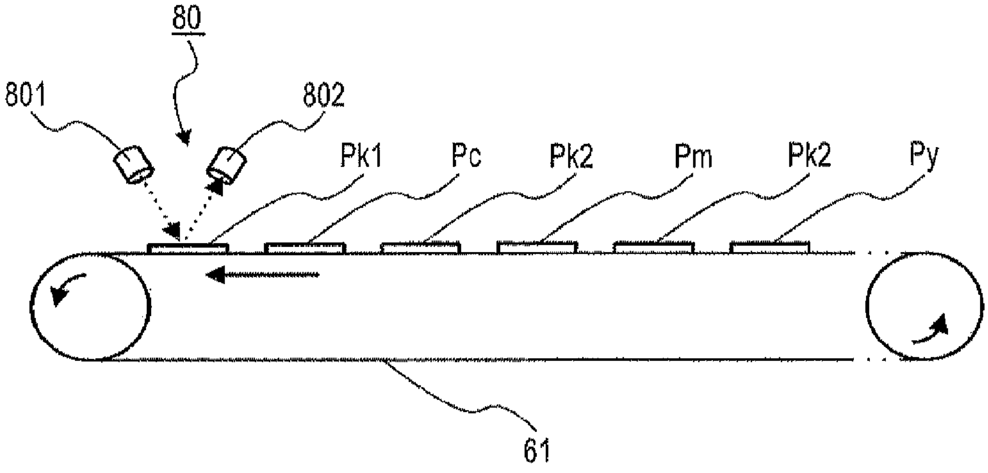
FIG. 7 is a side-face conceptual configuration diagram showing an arrangement of a density sensor and a situation of reading a correction patch.

On the other hand, for example, as shown in FIG. 7, the density sensor 80 is constructed from: a light emitting element 801 for projecting light onto the transfer belt 61; and a light receiving element 802 for receiving reflected light of the projected light arriving from the transfer belt 61 (correction patch P when a correction patch P is formed on the transfer belt 61).

After that, the correction patches Pk1, Pc, Pk2, Pm, Pk3, and Py of individual colors formed on the transfer belt 61 in the correction patch formation processing at the above-mentioned step S102 pass the reading position (projection position of the output light from the light emitting element 801) of the density sensor 80 in FIG. 7 sequentially in synchronization with the conveyance of the transfer belt 61.

Figure 8:
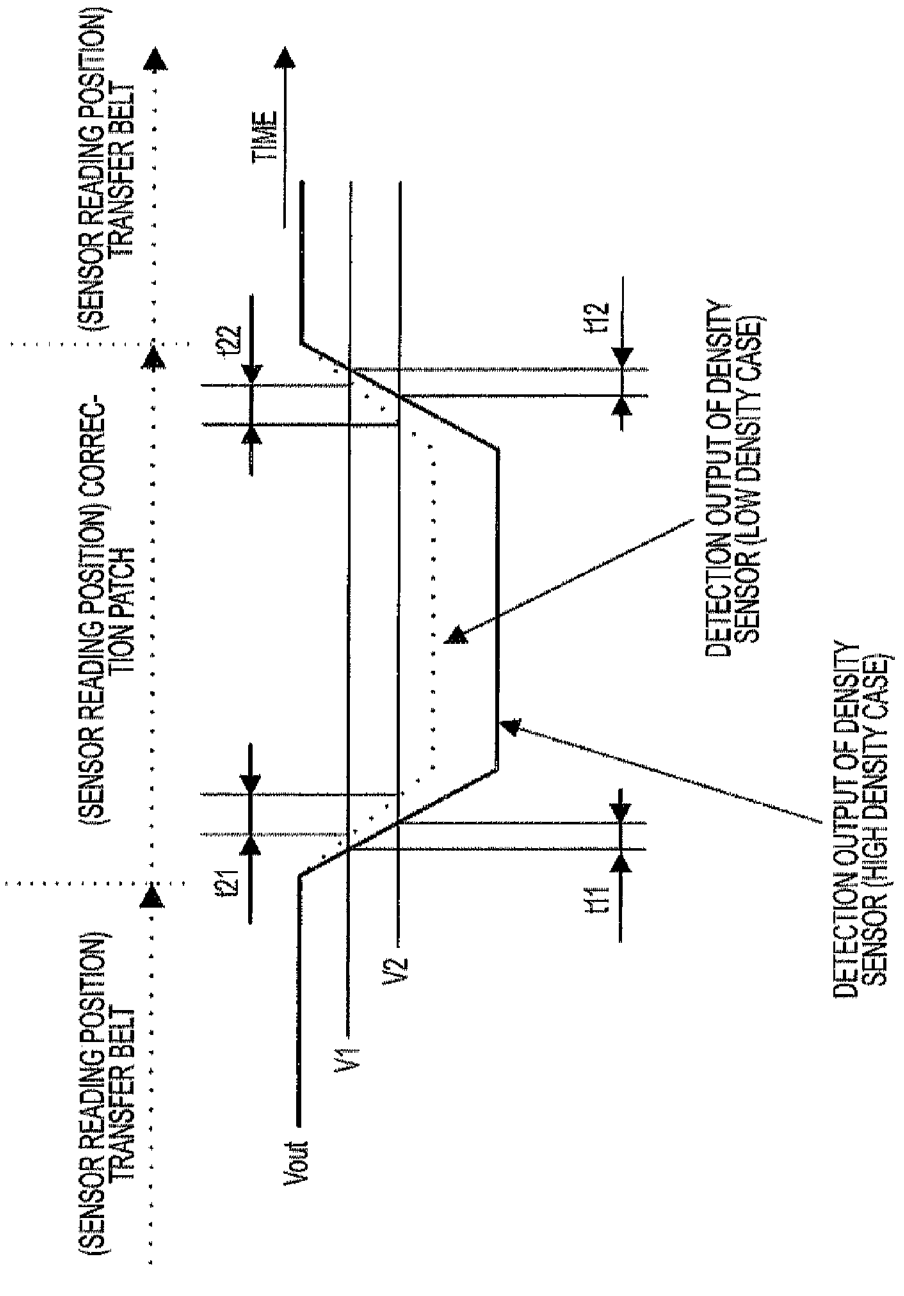
FIG. 8 is a diagram showing density detection output characteristics including fall and rise of a density sensor.

At that time, for example, as shown in FIG. 8, a density detection output (analog signal) Vout is obtained from the density sensor 80 (light receiving element 802) sequentially at each time of passage of the correction patches Pk1, Pc, Pk2, Pm, Pk3, and Py formed on the transfer belt 61.

Here, the detection output Vout of the density sensor 80 has output characteristics that the density detection level obtained when the leading edge part of the correction patch P of each color (Pk1, Pc, Pk2, Pm, Pk3, or Py) passes the reading position falls gradually from the density detection level of the transfer belt 61 to the density detection level of the correction patch P and that the density detection level obtained when the rear edge part of the correction patch P of each color passes the reading position rises gradually from the density detection level of the correction patch P to the density detection level of the transfer belt 61.

Further, when the density of the correction patch P serving as a detection target is high, as indicated by a solid line in FIG. 8, the detection output Vout of the density sensor 80 has a value remarkably lower than that obtained when the reflected light is received from the transfer belt 61. On the contrary, when the density is low, as indicated by a dotted line in FIG. 8, a value is realized that is near the value obtained when the reflected light is received from the transfer belt 61.

That is, in the detection output Vout of the density sensor 80, at the time of density detection for the correction patch P, the degree of change (inclination per unit time of the signal) at the time of fall and at the time of rise varies depending on the density.

Specifically, in FIG. 8, it is assumed that binarization is to be performed by comparing the detection output Vout of the density sensor 80 with the threshold values V1 and V2. Then, for example, as for the time elapsing after the detection output Vout goes lower than the threshold value V1 until the value farther goes lower than V2 at the time of fall of the detection output Vout (or alternatively the time elapsing after the detection output Vout goes higher than the threshold value V2 until the value further goes higher than V1 at the time of rise of the detection output Vout), the corresponding time (t11, t12) is short when the density is high, while the corresponding time (t21, t22) is long when the density is low.

That is, the time necessary for a change between the threshold values V1 and V2 at the time of fall or rise of the density detection output Vout of the correction patch P from the density sensor 80 corresponds to the density of the correction patch P serving as a detection target.

Further, the center of the time during which the detection output Vout of the density sensor 80 goes lower than the threshold value V1 and then goes higher than the threshold value V1 always indicates the position (center position) of the correction patch P regardless of the density of the correction patch P serving as a detection target.

In the exemplary embodiment, with focusing attention on the above-mentioned point, in the density measurement processing at step S103 in FIG. 5 described below, the density of the correction patch P serving as a detection target is detected on the basis of the time necessary for a change between the threshold values V1 and V2 at the time of fall or rise of the density detection output Vout of the correction patch P from the density sensor 80.

Similarly, in the patch position measurement processing at step S103, on the basis of the time elapsing in the course, for example, that the density detection output Vout of the correction patch P by the density sensor 80 goes lower than the threshold value V1 and then goes higher than the threshold value V1, the center of the time is calculated so that the position of the correction patch P serving as a detection target is detected.

The density measurement processing and the patch position measurement processing described here are executed after the correction patch P is formed at step S102 in FIG. 5 and then the image density/position detecting section 165 receives the input of the density detection output of the correction patch P from the density sensor 80 (step S103).

That is, in the density measurement processing and the patch position measurement processing at step S103, the detection output Vout of the density sensor 80 is inputted to the comparator 33 in the detection circuit section 30 (see FIG. 4) of the image density/position detecting section 165 as a comparison input relative to the input voltage (threshold value V1) from the D/A converter 31. On the other hand, the detection output Vout is inputted to the comparator 34 as a comparison input relative to the input voltage (threshold value V2) from the D/A converter 32.

Figure 9:
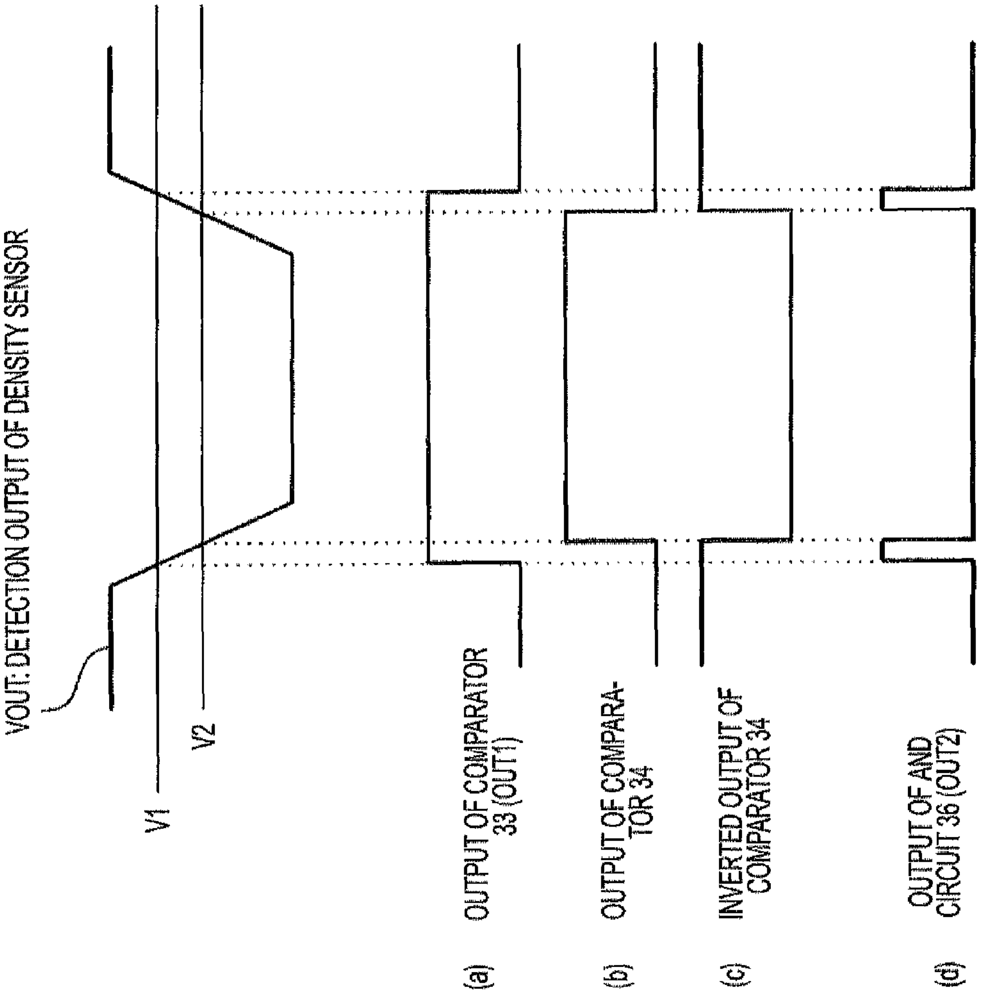
FIG. 9 is a timing chart of signals of a detection circuit section according to the first exemplary embodiment.

FIG. 9 is a timing chart of the signals from the individual sections of the detection circuit section 30 obtained when the detection output Vout of the density sensor 80 is inputted.

Here, FIG. 9 shows an example that the detection output Vout of the density sensor 80 for the correction patch Pk1 of the K color in the first among the correction patches P of individual colors formed on the transfer belt 61 in the mode shown in FIG. 6 is inputted, and that the relation between the detection output Vout and the threshold value V1 set up by the D/A converter 31 or the threshold value V2 set up by the D/A converter 32 is such that Vout (minimum) is smaller than the threshold values V1 and V2 and threshold value V1>threshold value V2 is satisfied as shown in the figure.

In the example in FIG. 9, in the comparator 33 of the detection circuit section 30, as shown in FIG. 9(*a*), an output (OUT1) is generated in which the level transits from "L (Low level)" to "H (High level)" at the timing that the detection output Vout goes lower than the threshold value V1 (threshold value V1 is reached) and in which after that, the level transits from "H" to "L" at the timing that the detection output Vout goes higher than the threshold value V1.

Further, in the comparator 34, as shown in FIG. 9(*b*), an output is generated in which the level transits from "L" to "H" at the timing that the detection output Vout goes lower than the threshold value V2 and in which after that, the level transits from "H" to "L" at the timing that the detection output Vout goes higher than the threshold value V2.

Further, as shown in FIG. 9(*c*), the output of the inverting circuit 35 has a value obtained by inverting the output of the comparator 34.

Further, the AND circuit 36 performs logical product (AND) operation onto the output of the comparator 33 shown in FIG. 9(*a*) and the output of the inverting circuit 35 shown in FIG. 9(*c*) so as to generate an output (OUT2) as shown in FIG. 9(*d*).

The output (OUT1) of the comparator 33 is inputted to the timer 41, while the output (OUT2) of the AND circuit 36 is inputted to the timer 42.

The timer 41 measures the time of the interval of "H" of the output (OUT1) of the comparator 33, and then outputs the result as data for patch position measurement.

The timer 42 counts the time of the interval of "H" of the output (OUT2) of the AND circuit 36, and then outputs the result as data for density detection.

On the basis of the time length (time width) of the interval of "H" of the output (OUT1) of the comparator 33 counted by the timer 41, the detection processing section 40 measures the position of the correction patch Pk1 of the K color.

Further, on the basis of the time length (time width) of the interval of "H" of the output (OUT2) of the AND circuit 36 counted by the timer 42, the density of the correction patch Pk1 of the K color is detected.

At step S103 in FIG. 5, when the processing of density detection and position measurement for the correction patch Pk1 of the K color according to the above-mentioned method is completed, the image density/position detecting section 165 checks whether the density and position measurement has been completed for all correction patches P (step S104). When it is determined that the density and position measurement for all correction patches P has not been completed yet (step S104: NO), density and position measurement processing is performed on all remaining correction patches (Pc, Pk2, Pm, Pk3, and Py: see FIG. 6) by a method similar to that employed for the correction patch Pk1 (step S103).

Figure 10:
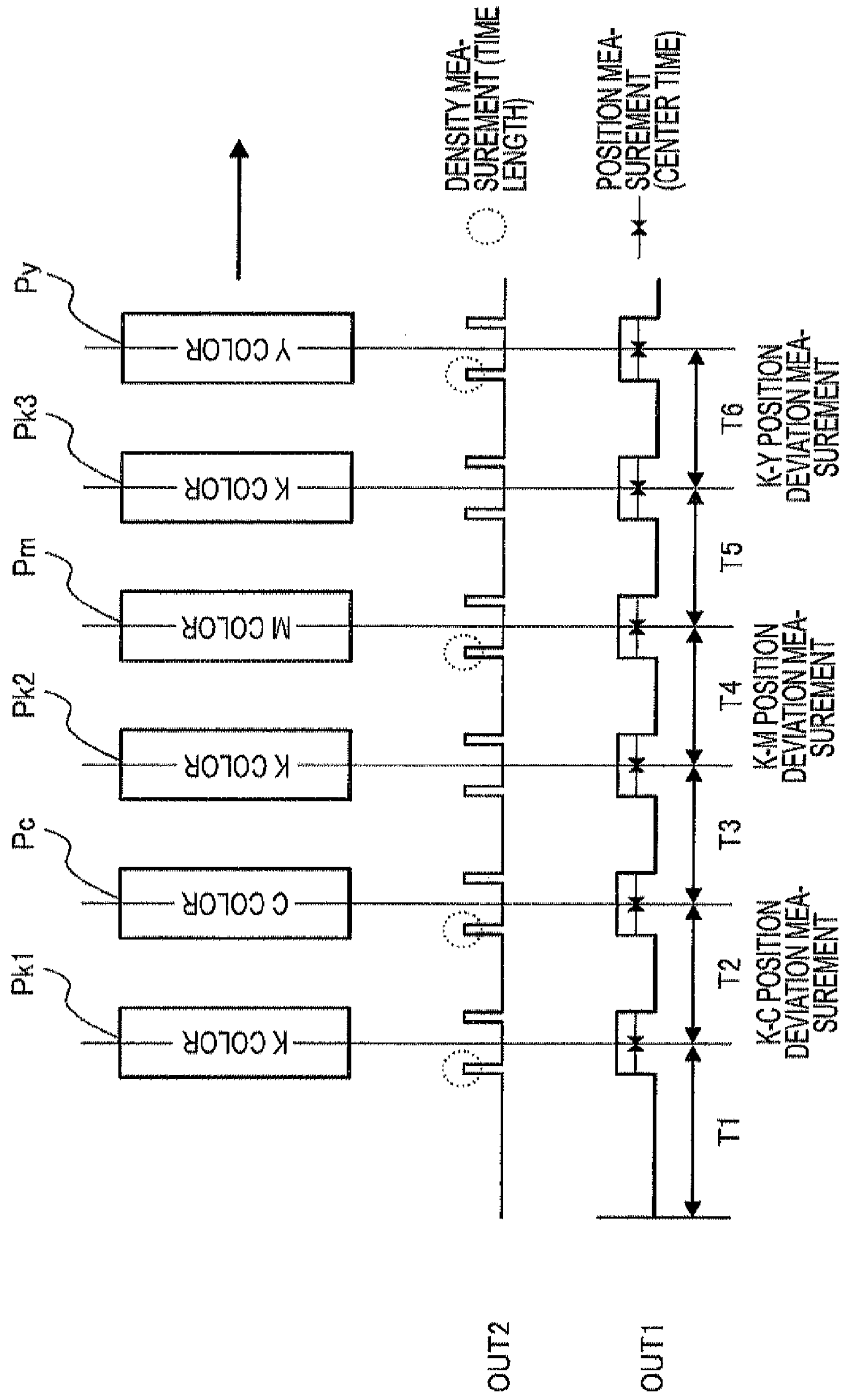
FIG. 10 is a conceptual diagram showing a flow of density and position measurement processing for a correction patch according to the first exemplary embodiment.

FIG. 10 is a conceptual diagram showing a flow of density and position measurement processing for all correction patches P (Pk1 to Py) at step S103.

As shown in FIG. 10, in the image density/position detecting section 165, on the basis of the process signal (see FIG. 9) in the detection circuit section 30 of the detection output Vout of the density sensor 80 for the correction patches Pk1, Pc, Pk2, Pm, Pk3, and Py, and as for the density of the correction patches Pk1, Pc, Pm, and Py, for each correction patch P, on the basis of the time length (time width) of OUT2 obtained at the time of fall among the OUT2 signals each measured once (two times in total) by the timer 42 of the detection processing section 40 at the time of rise or at the time of fall of the above-mentioned detection output Vout, the density of the corresponding correction patch P is detected at each timing indicated by a dotted-line circle in FIG. 10.

However, for the correction patches Pk1, Pk2, and Pk3 of the K color, the density may be detected only for the first correction patch Pk1.

Further, in the position measurement, for example, as for the correction patch Pk1 of the K color among the correction patches Pk1, Pc, Pk2, Pm, Pk3, and Py, the center time is calculated from the time length (time width) of OUT1 outputted from the comparator 33 of the detection circuit section 30 counted by the timer 41 of the detection processing section 40. Then, on the basis of the center time, the position of each correction patch Pk of the K color is measured.

After that, similarly for the correction patch Pc of the C color, the correction patch Pk2 of the K color, the correction patch Pm of the M color, the correction patch Pk3 of the K color, and the correction patch Py of the Y color, the center time is calculated from the time length of OUT1 outputted from the comparator 33 of the detection circuit section 30 counted by the timer 41 of the detection processing section 40. Then, on the basis of the center time, the position of each correction patch Pc, Pk2, Pm, Pk3, or Py is measured.

Here, in the density/color deviation correction control section 162, on the basis of the positions of the correction patches Pk1, Pc, Pk2, Pm, Pk3, and Py detected by the image density/position detecting section 165 by the method described above, the color deviation correction control section 166 calculates the intervals (T1, T2, T3, T4, T5, and T6; here, T1 is the interval from the Pk1 drawing start timing to Pk1) between these correction patches Pk1, Pc, Pk2, Pm, Pk3, and Py, then compares these values with the intervals between these patches P set up in advance as criterion values so as to measure, for example, the position deviation between the K color and the C color (K-C position deviation), the position deviation between the K color and the M color (K-M position deviation), and the position deviation with the K color and the Y color (K-Y position deviation), and then performs position deviation correction control for a color whose position deviation is determined as being outside the range of the criterion value (see steps S122 to S124 in FIG. 5 described later).

FIG. 10 shows a case that the density detection output Vout of the density sensor 80 reaches the threshold values V1 and V2. However, depending on the density of the correction patch P, in some cases, a situation occurs that the density detection output Vout of the density sensor 80 does not reach the threshold value V1 or V2.

Figure 11:
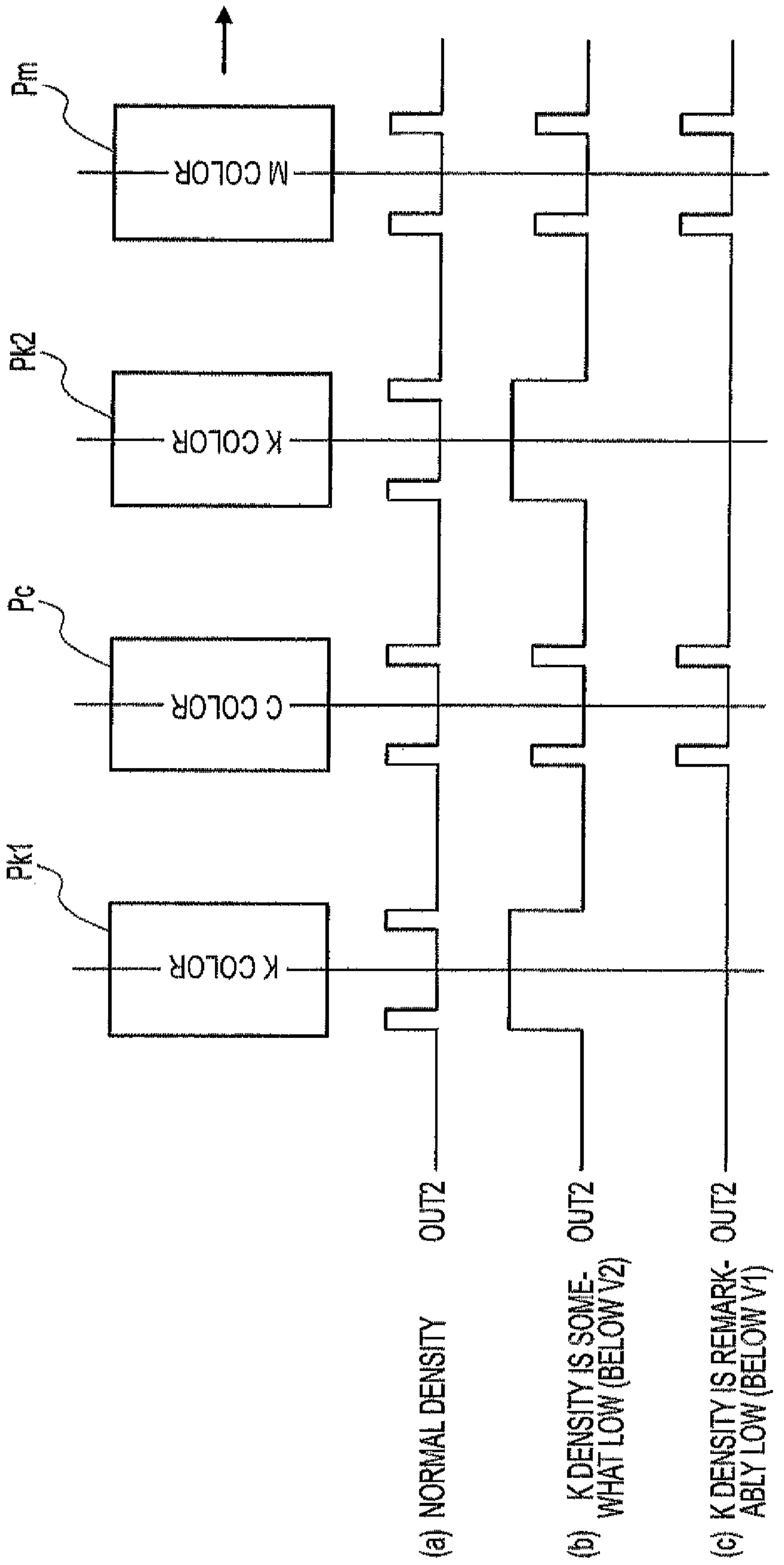
FIG. 11 is a conceptual diagram showing a flow of density and position measurement processing when a density detection output does not reach a threshold value.

FIG. 11 is a conceptual diagram showing a flow of density and position measurement processing for the correction patch P with taking into consideration a situation that the density detection output Vout of the density sensor 80 does not reach the threshold value V1 or V2.

FIG. 11(*a*) shows an example that the density of the correction patch P is appropriate. In this case, the density detection output Vout of each correction patch P from the density sensor 80 reaches the threshold values V1 and V2. Thus, the time length of the "H" level of OUT2 at the time of rise and at the time of fall can respectively be counted by the timer 42, so that the density can normally be detected.

In contrast, FIG. 11(*b*) shows an example that the density of the correction patch Pk (PK1, Pk2, or Pk3) of the K color is somewhat low. In this case, the density detection output Vout of the correction patch Pk of the K color from the density sensor 80 does not reach the threshold value V2, and hence the OUT2 for the correction patch Pk of the K color is at an "H" level continuously in the course from the time of fall to the time of rise. Thus, density measurement cannot be performed (the density of the correction patch P can be measured for the C, M, and Y colors having a normal density).

Further, FIG. 11(*c*) shows an example that the density of the correction patch Pk of the K color is remarkably low. In this case, the density detection output Vout of the correction patch Pk of the K color from the density sensor 80 does not even reach the threshold value V1, and hence the OUT2 for the correction patch Pk of the K color is at an "L" level continuously in the course from the time of fall to the time of rise. Thus, density measurement cannot be performed (the density of the correction patch P can be measured for the C, M, and Y colors having a normal density).

In the image forming apparatus 10 according to the exemplary embodiment, the image density/position detecting section 165 has a control function of changing and setting the threshold value V1, the threshold value V2, or the threshold values V1 and V2 such that even in case of the presence of a correction patch P having such a low density that the density detection output Vout of the density sensor 80 does not reach the presently set-up threshold value V1 or V2 (an output abnormality in OUT2 in which the level stays at an "H" or "L" level continuously in the course from the time of fall to the time of rise), the density should be detectable for the correction patch P having the low density.

From this point of view, the density measurement processing at step S103 in FIG. 5 is described below in further detail with reference to a detailed flowchart shown in FIG. 12.

Figure 12:
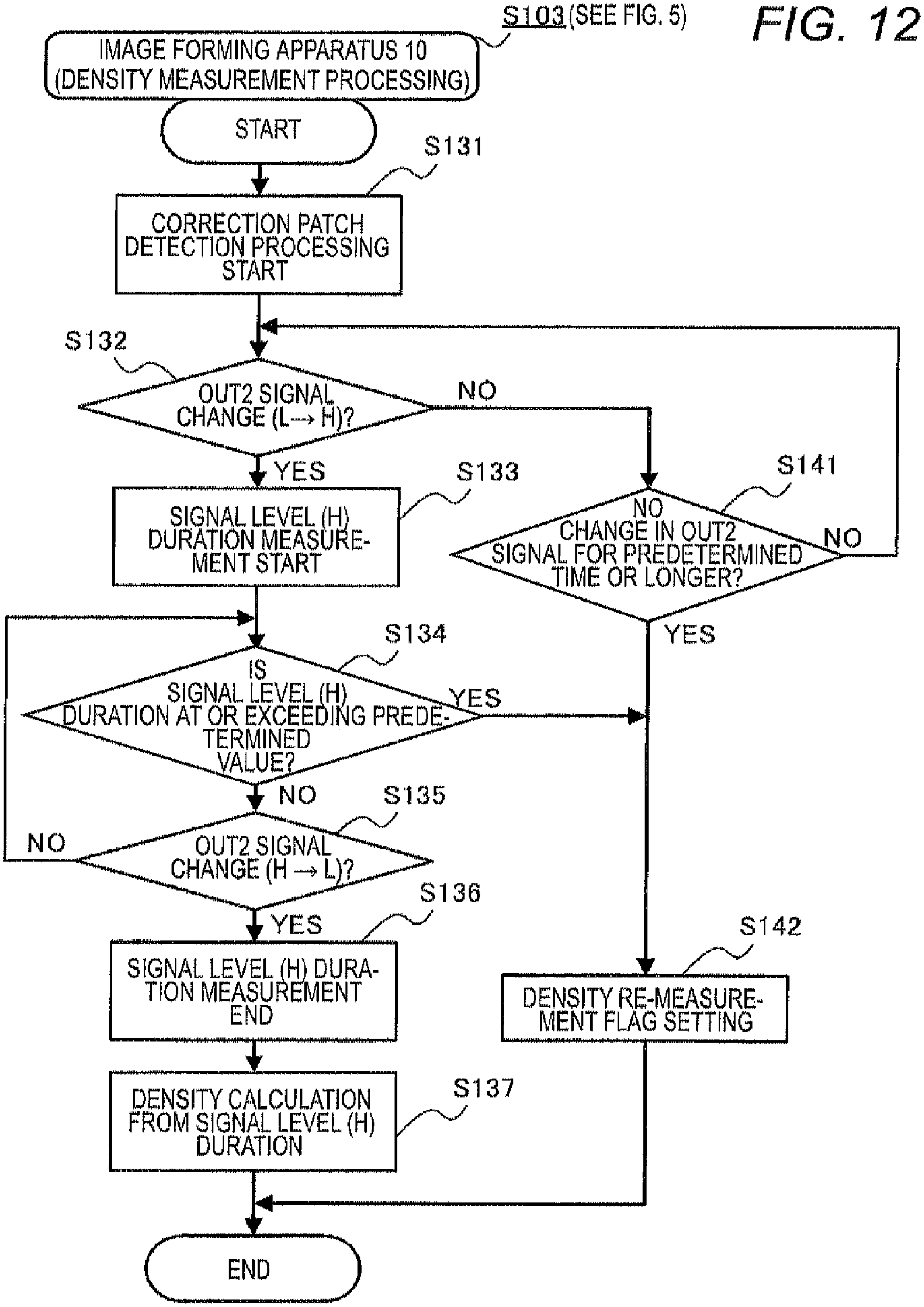
FIG. 12 is a detailed flowchart of density measurement processing at step S103 in FIG. 5.

As shown in FIG. 12, in the density measurement processing at step S103 in FIG. 5, the density detection output Vout of the density sensor 80 is acquired into the detection circuit section 30, and then correction patch detection processing is started (step S131).

First, it is monitored whether the OUT2 of the detection circuit section 30 has transited from an "L" level to an "H" level (step S132). In case of the presence of a level (signal) change (step S132: YES), the timer 42 of the detection processing section 40 starts measurement of the signal level duration (step S133).

Then, with monitoring whether the measurement result of the signal level duration reaches or exceeds a predetermined value (step S134), it is monitored whether the OUT2 signal of the detection circuit section 30 has transited from an "H" level to an "L" level (step S135).

Here, before the measurement result of the signal level duration reaches or exceeds the predetermined value (step S134: NO), in a case that the OUT2 signal of the detection circuit has transited from an "H" level to an "L" level (step S135: YES), the measurement of the signal level duration is terminated (step S136). Then, the density of the correction patch P serving as a detection target that has outputted the OUT2 is calculated from the measured signal level duration (step S137).

In contrast, at the above-mentioned step 132, in a case that the OUT2 of the detection circuit section 30 does not generate a level (signal) change from an "L" level to an "H" level (step S132: NO), it is checked whether this duration without a change has continued for a predetermined duration or longer (step S141).

Here, when it is determined that the duration without a change has continued for the predetermined duration or longer (step S141: YES), the density re-measurement flag is set up, and then the processing is terminated.

Further, in a state that the OUT2 of the detection circuit section 30 has not yet transited from an "H" level to an "L" level at the above-mentioned step S135 (step S135: NO), when it is determined at the above-mentioned step S134 that the measurement result of the signal level duration has reached or exceeded the predetermined value (step S134: YES), the density re-measurement flag is set up, and then the processing is terminated.

Further, at step S103 in FIG. 5, the image density/position detecting section 165 performs position measurement processing at the same time as the density measurement processing described in detail with reference to FIG. 12. Detailed operation of this position measurement processing is described below with reference to a detailed flowchart shown in FIG. 13.

Figure 13:
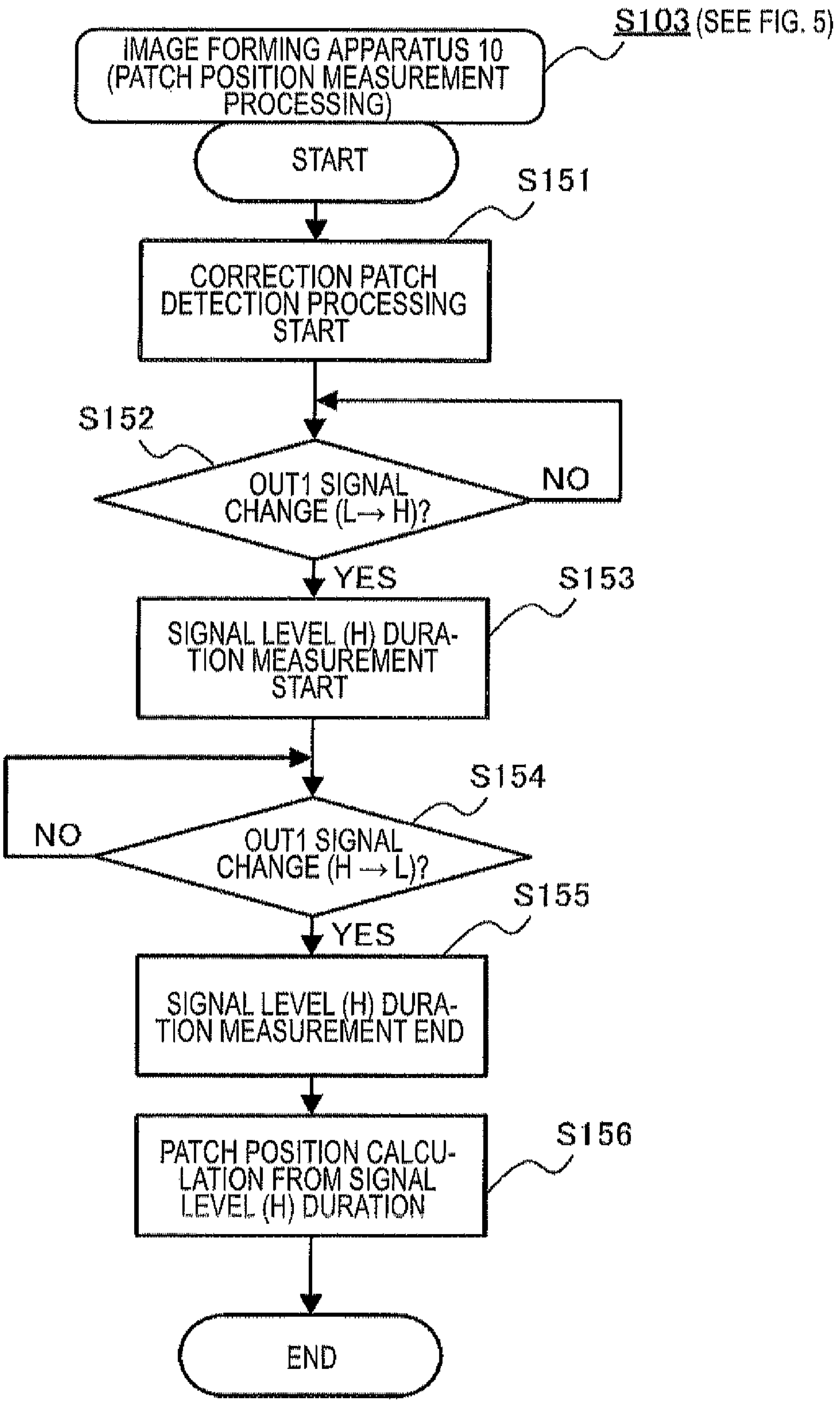
FIG. 13 is a detailed flowchart of patch position measurement processing at step S103 in FIG. 5.

As shown in FIG. 13, in the position measurement processing at step S103 in FIG. 5, the density detection output Vout of the density sensor 80 is acquired into the detection circuit section 30, and then patch position detection processing is started (step S151).

First, it is monitored whether the OUT1 of the detection circuit section 30 has transited from an "L" level to an "H" level (step S152). In case of the presence of a level (signal) change (step S152: YES), the timer 41 of the detection processing section 40 starts measurement of the signal level duration (step S153).

Then, it is monitored whether the OUT1 of the detection circuit section 30 has transited from an "H" level to an "L" level (step S154). In case of the presence of a level (signal) change (step S154: YES), the timer 41 stops the measurement of the signal level duration (step S155).

Then, the center time is calculated from the above-mentioned signal level duration measured by the timer 41. Then, the center time is adopted as the position of the correction patch P serving as a detection target having caused the output OUT1 (step S156).

At step S103 in FIG. 5, after the density measurement processing (see FIG. 12 for details) and the position measurement processing (see FIG. 13 for details) have been completed for all correction patches P, the image density/position detecting section 165 checks whether the density re-measurement flag has been set up in the above-mentioned density measurement processing (step S105).

Here, when it is determined that the density re-measurement flag has been set up (step S105: YES), the image density/position detecting section 165 checks the number (N) of times of threshold value change which is incremented by "+1" at each time that the threshold values V1 and V2 are changed (step S111).

Here, in a case that the number (N) of times of threshold value change is, for example, less than 3 ("N<3" at step S111), the image density/position detecting section 165 adjusts the digital signal to be inputted to the D/A converter 31 of the detection circuit section 30 (see FIG. 4) or alternatively the digital signal to be inputted to the D/A converter 32, so as to change and set the threshold value V1 or V2 or the threshold values V1 and V2 (step S112). Then, the procedure goes to step S103 so that the density measurement processing and the image position measurement processing are performed again.

At step S105, during the time when the density re-measurement flag is determined as having been set up (step S105: YES), in the repeated execution of the changing and setting of the threshold value V1 or V2 or the threshold values V1 and V2 (step S112) and the density measurement processing and the image position measurement processing (step S103), when the number (N) of times of threshold value change reaches a value, for example, greater than or equal to 3 and smaller than 5 ("N<5" at step S111), the density correction control section 166 receives instruction of execution of density correction. Then, on the basis of this instruction, the density correction control section 166 performs control such that toner of the corresponding color is supplied to the development section 54 of the image forming unit 50 of the corresponding color (the color in which the density detection output Vout of the density sensor 80 did not reach the threshold value V1 or V2) (step S113). Then, the procedure goes to step S103 so that the density measurement processing and the image position measurement processing are performed again.

In a case that even after the toner density correction at step S113 is performed repeatedly, it is determined that the density re-measurement flag has been set up (step S105: YES) and that the number (N) of times of threshold value change reaches, for example, 5 ("N=5" at step S111), a situation that the density of a color is abnormal and toner replacement is necessary is notified to the user (step S114), for example, by a method of displaying a message of requesting toner replacement of the corresponding color (the color in which the density detection output Vout of the density sensor 80 did not reach the threshold value V1 or V2) onto the display panel of the display/operation section 15. Then, the processing is terminated.

In contrast, at the above-mentioned step S105, when it is determined that the density re-measurement flag is not set up (step S105) (this includes also the time of determination at the timing after the changing and setting of the threshold values V1 and V2 at step S112 and after the density correction control at step S113), the density correction control section 166 determines whether the toner density of each color is normal or abnormal (outside a predetermined range; a low density) on the basis of the density measurement result obtained at the above-mentioned step S103 (step S121: density determination processing).

Here, when it is determined that the toner density of each color is normal and hence correction is unnecessary (step S122), the processing is terminated.

In contrast, when it is determined that the toner density of any color is abnormal and hence correction is necessary (step S122: YES), a correction value is calculated for correcting into a normal density the toner density of the color whose toner density has been determined as abnormal (low) (step S123). Then, on the basis of the calculated correction value, toner density correction processing is performed in which toner of the corresponding color is supplied to the development section 54 of the image forming unit 50 of the corresponding color (step S124). Then, the processing is terminated.

Further, when it is determined that the density re-measurement flag is not set up (step S105: NO), the color deviation correction control section 167 calculates the intervals T2, T3, T4, T5, and T6 between the correction patches P on the basis of the patch position measurement result obtained at the above-mentioned step S103 (see FIG. 10). Then, the color deviation correction control section 167 compares the results with the interval (criterion value) between the correction patches P set up in advance, so as to determine the presence or absence of a correction patch P having a deviation from a criterion value by a predetermined distance or greater (step S121: color deviation determination processing).

Here, when it is determined that the above-mentioned intervals between the correction patches P fall within the range of criterion value and hence correction is unnecessary (step S122), the processing is terminated.

In contrast, when it is determined that an interval between correction patches P falls outside the range of criterion value and hence correction is necessary (step S122: YES), a correction value is calculated for maintaining the interval within the range of criterion value (step S123). Then, on the basis of the calculated correction value, the scanning start timing of the exposure system in the exposure section 51 of the image forming unit 50 of the corresponding color is adjusted so that color deviation correction control is performed such that the intervals between the correction patches P of individual colors fall within the predetermined range.

As such, in the exemplary embodiment, with focusing attention on the characteristics (see FIG. 8) of the density detection output Vout of the density sensor 80, the density of the correction patch P is detected on the basis of the time length (time width) of the time elapsing in the course that the density detection output Vout of the density sensor 80 varies from the threshold value V1 to the threshold value V2 at the time of fall or alternatively of the time elapsing in the course that the density detection output varies from the threshold value V2 to the threshold value V1 at the time of rise. On the other hand, the center of the time length (time width) of the time when the density detection output Vout of the density sensor 80 is at or exceeding the threshold value V1 in the course from the time of fall to the time of rise is detected as the position of the correction patch P.

As a result, in the exemplary embodiment, a circuit for detecting the density of the correction patch P from the density detection output Vout of the density sensor 80 and a circuit for measuring the position can be made common (see the detection circuit section 30 in FIG. 4). This permits cost reduction in the detection circuit and simplification of the control.

Further, the detection circuit in which a circuit for detecting the density and a circuit for measuring the position are made common contributes also to reduction in the warm-up time and the first print time.

Second Exemplary Embodiment

Figure 14:
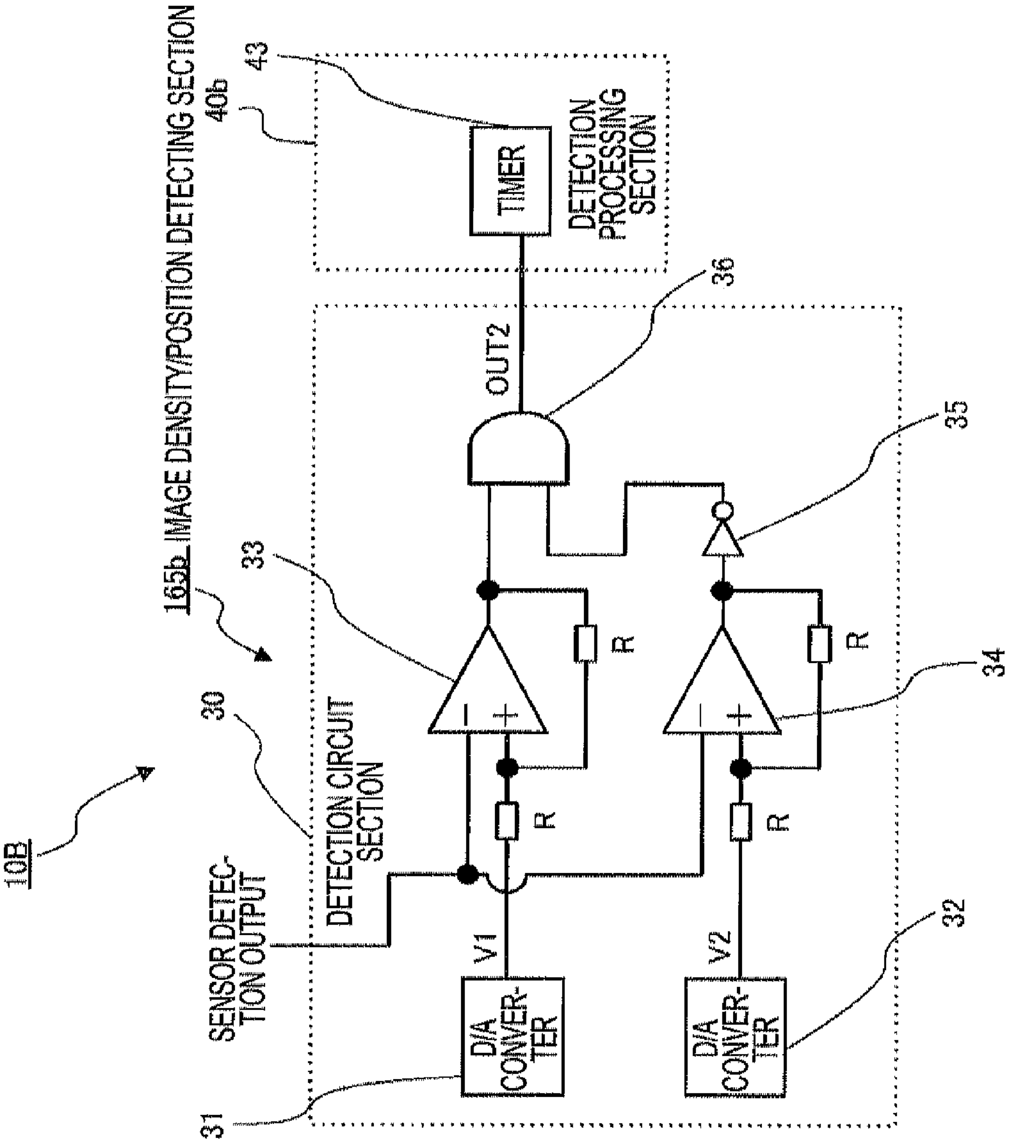
FIG. 14 is a circuit diagram showing an image density/position detecting section according to a second exemplary embodiment.

FIG. 14 is a circuit diagram showing an image density/position detecting section 165*b* of an image forming apparatus (designated by 10B for simplicity) according to a second exemplary embodiment of the present invention.

In the image density/position detecting section 165*b*, similarly to the first exemplary embodiment (see FIG. 4), the detection circuit section 30 has D/A converters 31 and 32, comparators 33 and 34, an inverting circuit 35, and an AND circuit 36. However, the detection processing section 40*b* is constructed solely from a timer 43 for counting the time length of the output binary signal (OUT2) of the AND circuit 36.

In the image forming apparatus 10B, the image density/position detecting section 165*b* having the configuration shown in FIG. 14 detects the density and the position of the correction patch P on the basis only of the output binary signal OUT2 of the AND circuit 36 (In contrast to the first exemplary embodiment, the output binary signal of the comparator 33 is not used as OUT1).

Figure 15:
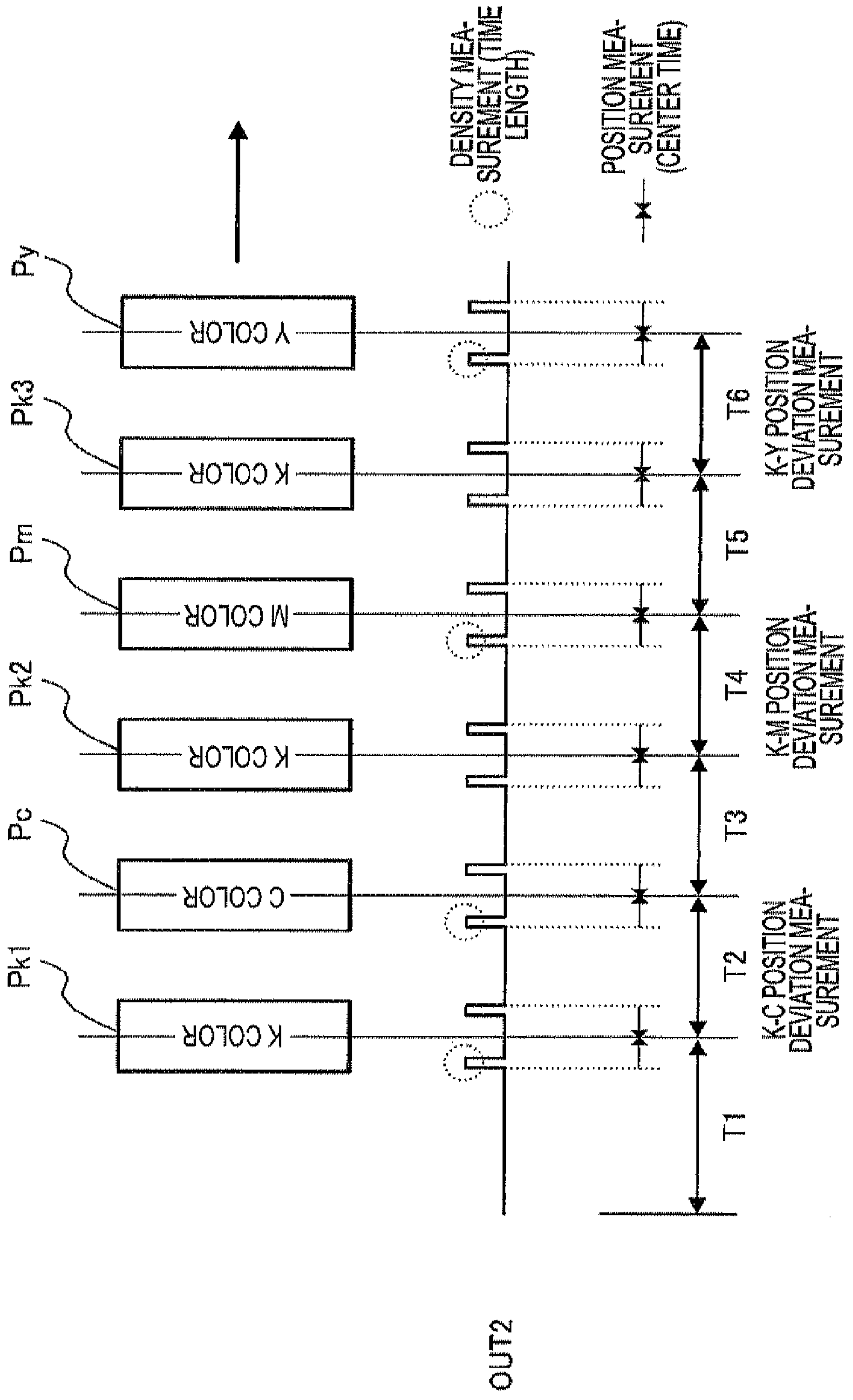
FIG. 15 is a conceptual diagram showing a flow of density and position measurement processing for a correction patch according to the second exemplary embodiment.

FIG. 15 is a conceptual diagram showing a flow of density and position measurement processing for the correction patches Pk1, Pc, Pk2, Pm, Pk3, and Py performed in the image forming apparatus 10B according to the exemplary embodiment.

As shown in FIG. 15, in the image density/position detecting section 165*b*, as for the density of the correction patches Pk1, Pc, Pm, and Py, similarly to the first exemplary embodiment (see FIG. 10), for each correction patch P, on the basis of the time length of OUT2 obtained, for example, at the time of fall among the OUT2 signals each measured once (two times in total) by the timer 43 of the detection processing section 40*b* at the time of rise or at the time of fall of the above-mentioned detection output Vout, the density of the corresponding correction patch P is detected at each timing indicated by a dotted-line circle in FIG. 15.

On the other hand, as for the position measurement, for the correction patches Pk1, Pc, Pk2, Pm, Pk3, and Py, the time length from the edge of the leading edge part of the first OUT2 (at the time of fall) to the edge of the rear edge part of the second OUT2 (at the time of rise) among the OUT2 signals measured twice at the time of fall and at the time of rise for each correction patch P by the timer 43 of the detection processing section 40*b* (the time length between the leading edge of the time elapsing in the course that the density detection output Vout of the density sensor 80 varies from the threshold value V1 to the threshold value V2 at the time of fall and the rear edge of the time elapsing in the course that density detection output varies from the threshold value V2 to the threshold value V1 at the time of rise) is counted by the timer 43. Then, the center time of the counted time is measured as the position of each correction patch Pk of the K color.

Further, on the basis of the positions of the correction patches Pk1, Pc, Pk2, Pm, Pk3, and Py detected by the image density/position detecting section 165, the color deviation correction control section 166*b* calculates the intervals (T1, T2, T3, T4, T5, and T6; here, T1 is the interval from the Pk1 drawing start timing to Pk1) between these correction patches Pk1, Pc, Pk2, Pm, Pk3, and Py, then compares these values with the intervals between these patches P set up in advance as criterion values so as to measure, for example, the position deviation between the K color and the C color (K-C position deviation), the position deviation between the K color and the M color (K-M position deviation), and the position deviation with the K color and the Y color (K-Y position deviation), and then performs position deviation correction control for a color whose position deviation is determined as being outside the range of the criterion value.

Similarly to the first exemplary embodiment, the color deviation/density correction control in the image forming apparatus 10B according to the exemplary embodiment is performed in accordance with the flowchart shown in FIG. 5. Further, the density measurement processing at step S103 in FIG. 5 is also performed similarly to the first exemplary embodiment (see FIG. 12).

Figure 16:
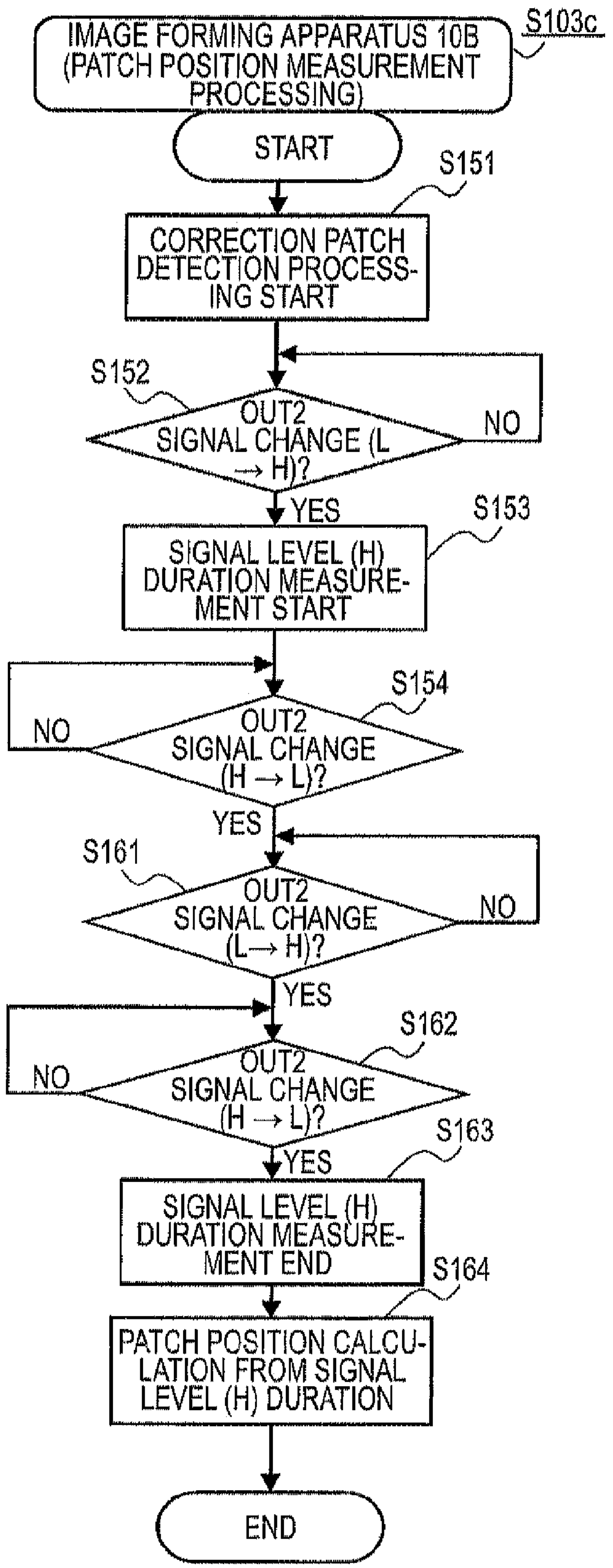
FIG. 16 is a detailed flowchart of patch position measurement processing according to the second exemplary embodiment.

In contrast, the position measurement processing at step S103 in FIG. 5 is performed in accordance with a flowchart shown in FIG. 16. In FIG. 16, like processing steps to those in the position measurement processing according to the first exemplary embodiment shown in FIG. 13 are designated by like reference numerals.

In the image forming apparatus 10B, as shown in FIG. 16, at the time of position measurement processing at step S103 in FIG. 5, the density detection output Vout of the density sensor 80 is acquired into the detection circuit section 30 of the image density/position detecting section 165*b* (see FIG. 14). Then, the detection processing section 40*b* starts correction patch detection processing (step S151).

First, the detection processing section 40*b* monitors whether the OUT2 of the detection circuit section 30 has transited from an "L" level to an "H" level (step S152). In case of the presence of a level (signal) change (step S152: YES), the timer 43 starts measurement of the signal level duration (step S153).

Further, it is monitored whether the OUT2 of the detection circuit section 30 has transited from an "H" level to an "L" level (step S154). Then, in case of the presence of a level (signal) change (step S154: YES), monitoring is continued whether the OUT2 of the detection circuit section 30 has transited from an "L" level to an "H" level (step S161).

Here, in case of the presence of a level (signal) change (step S161: YES), it is further monitored whether the OUT2 has transited from an "H" level to an "L" level (step S162). Then, in case of the presence of a level (signal) change (step S162: YES), the timer 43 starts measurement of the signal level duration (step S163).

Then, the center time is calculated from the above-mentioned signal level duration measured by the timer 43. Then, the center time is adopted as the position of the correction patch P serving as a detection target having caused the output OUT2 (step S164).

As such, in the exemplary embodiment, with focusing attention on the characteristics (see FIG. 8) of the density detection output Vout of the density sensor 80, the density of the correction patch P is detected on the basis of the time length (time width) of the time elapsing in the course that the density detection output Vout of the density sensor 80 varies from the threshold value V1 to the threshold value V2 at the time of fall or alternatively of the time elapsing in the course that the density detection output varies from the threshold value V2 to the threshold value V1 at the time of rise. On the other hand, the position of the correction patch P is detected on the basis of the time length (time width) between the leading edge of the time elapsing in the course that the density detection output of the density sensor 80 varies from the threshold value V1 to the threshold value V2 at the time of fall and the rear edge of the time elapsing in the course that the density detection output varies from the threshold value V2 to the threshold value V1 at the time of fall.

Third Exemplary Embodiment

Figure 17:
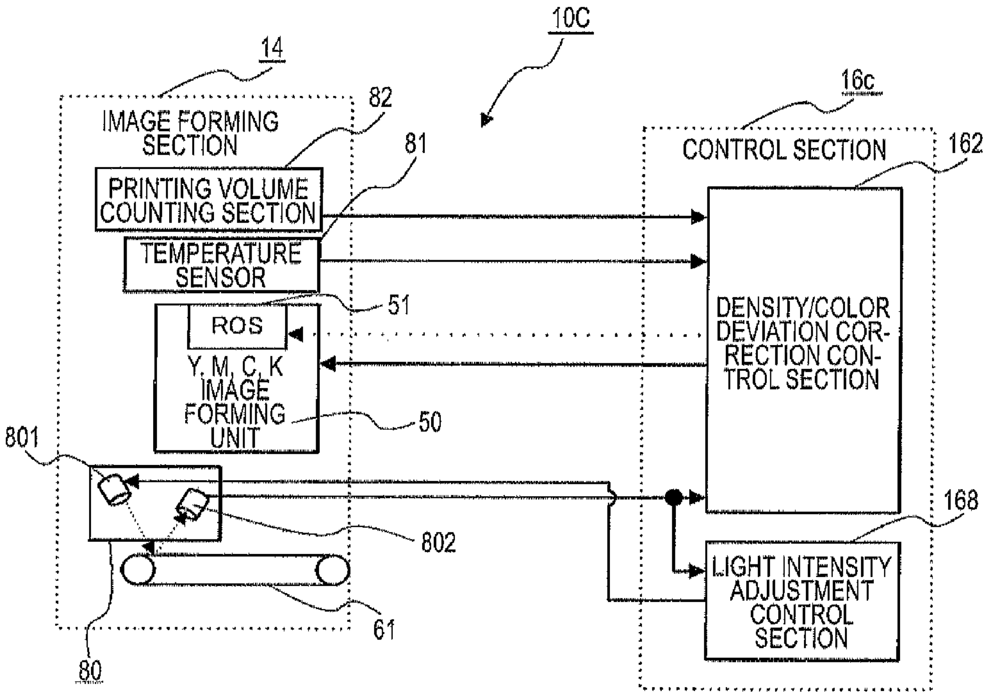
FIG. 17 is a schematic diagram showing a control system of an image forming apparatus according to a third exemplary embodiment.

FIG. 17 is a schematic diagram showing a control system including correction control for the density and the color deviation of the correction patch P in an image forming apparatus (designated by 10C for simplicity) according to a third exemplary embodiment.

As shown in FIG. 17, in addition to the density/color deviation correction control section 162 provided in the control system (see FIG. 3) of the image forming apparatus 10 according to the first exemplary embodiment, the control system according to the exemplary embodiment has a light intensity adjustment control section 168 for adjusting (variable control) the emitted light intensity (light emission driving current) of the light emitting element 801 of the density sensor 80 such that the light receiving element 803 of the density sensor 80 should generate an appropriate light receiving output that reliably reaches the threshold value V2 at the time of density detection for the correction patch P.

The light intensity adjustment control in the light intensity adjustment control section 168 is performed as follows. That is, at the timing that a region on the transfer belt 61 where a correction patch P is not formed (a roughened surface part of the transfer belt 61) passes the density detection position (projection position of the projected light from the light emitting element 801) of the density sensor 80, light is projected from the light emitting element 801 of the density sensor 80 onto the roughened surface part of the transfer belt 61. Then, the light reflected from the roughened surface of the transfer belt 61 is detected as the light receiving output by the light receiving element 802.

Specifically, light emission drive is started from the state that the light emitting element 801 of the density sensor 80 is OFF. Then, with gradually increasing the light emission intensity, the light receiving output of the light receiving element 802 obtained when the reflected light of the projected light from the light emitting element 801 arriving from the roughened surface of the transfer belt 61 is received by the light receiving element 802 is acquired into the two comparators 33 and 34 in the detection circuit section 30 (see FIG. 4) of the image density/position detecting section 165. Then, the output values OUT1 and OUT2 are observed that are obtained as the comparison results with the adjustment values (threshold values V11 and V21 for light intensity adjustment control; see FIG. 19) having been set up in the comparators 33 and 34, respectively.

Figure 18A:
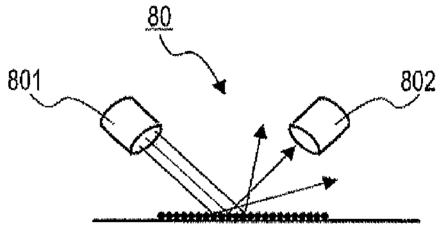
FIGS. 18A and 18B are conceptual diagrams showing comparison of optical paths of a density sensor between high and low density cases.
Figure 18B:
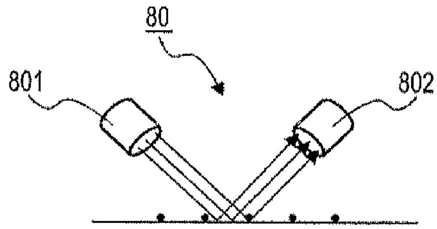

Meanwhile, as seen from the comparison conceptual diagram of the optical paths for high and low density cases shown in FIGS. 18A and 18B, the density detection output characteristics of the density sensor 80 is such that: in a high density case, the projected light from the light emitting element 801 is irregularly reflected by the toner (see FIG. 18A) so that the received light intensity of the light receiving element 802 decreases; and in a low density case, the above-mentioned projected light is reflected by the smooth transfer belt 61 (see FIG. 18B) so that the received light intensity of the light receiving element 802 increases.

Figure 19:
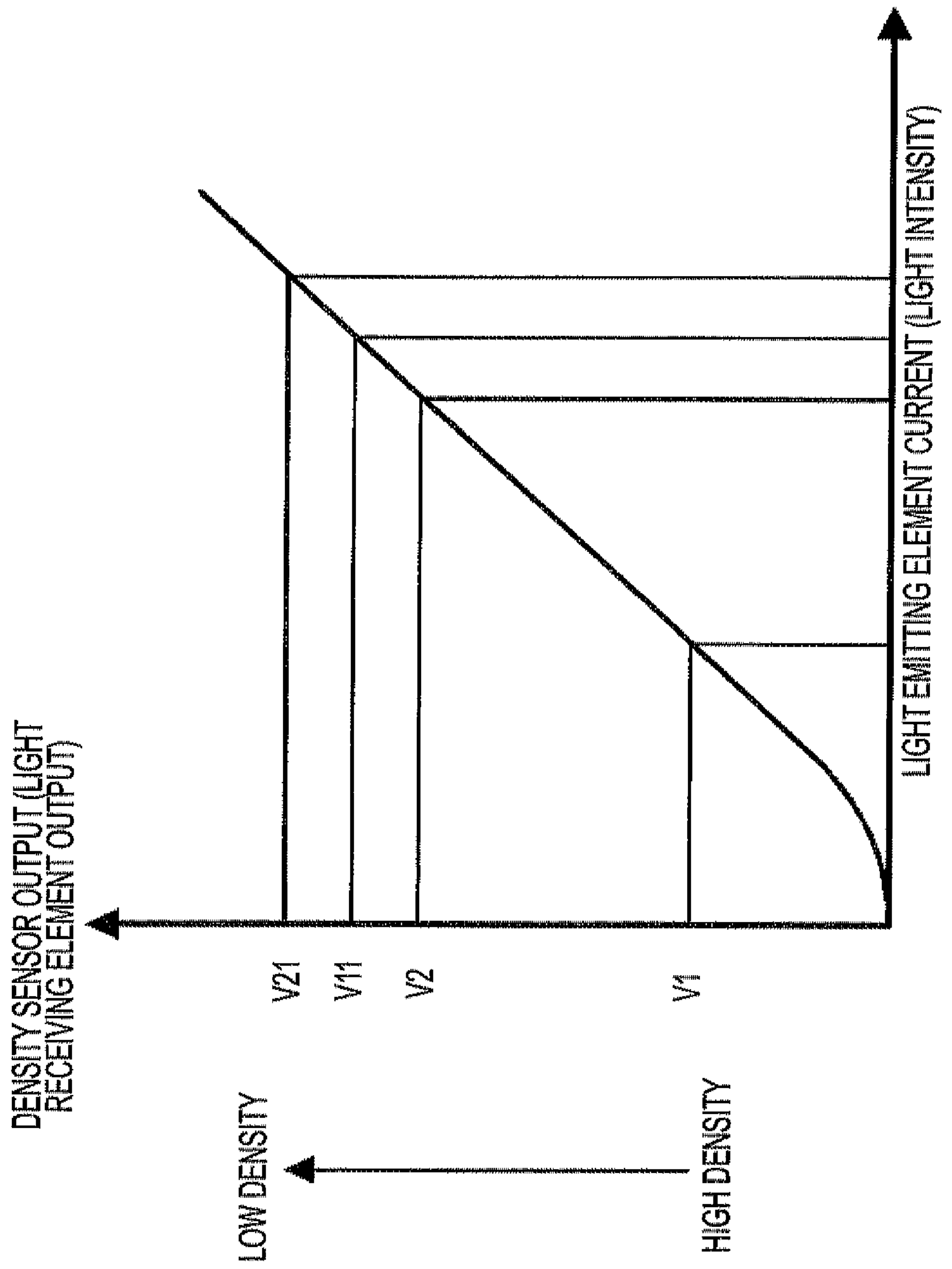
FIG. 19 is a diagram showing light emission output vs. light receiving output characteristics including a threshold value setting range for light intensity adjustment control.

In the image forming apparatus 10C according to the exemplary embodiment, with taking into consideration the above-mentioned output characteristics of the density sensor 80, the light intensity adjustment control section 168 sets up, for example, the threshold values V11 and V21 for light intensity adjustment control into the two comparators 33 and 34 in the detection circuit section 30 (see FIG. 4) as shown in FIG. 19 so as to control the light emission drive of the light emitting element 801 such that the light receiving output of the light receiving element 802 of the density sensor 80 should have a value (adjustment value) within the range of the threshold values V11 and V21.

In a case that a threshold value V11 (lower limit of the adjustment value) and a threshold value V21 (upper limit of the adjustment value) are set up into the comparators 33 and 34 respectively as comparison inputs (threshold values) with the density detection output of the density sensor 80, when the light receiving output of the density sensor 80 is lower than the lower limit V11, in the detection circuit section 30, the outputs of the comparators 33 and 34 are both at an "L" level in accordance with the logical configuration (see FIG. 4) of the circuit. Thus, the OUT1 and the OUT2 are both at an "L" level.

Accordingly, when the OUT1 and the OUT2 are both at an "L" level, the light emission driving current for the light emitting element 801 need be increased.

Further, when the light receiving output of the density sensor 80 is at or above the upper limit V21, in the detection circuit section 30, the outputs of the comparators 33 and 34 are both at an "H" level. Thus, the OUT1 is at an "H" level and the OUT2 is at an "L" level.

Accordingly, when the OUT1 is at an "H" level and the OUT2 is at an "L" level, the light emission driving current for the light emitting element 801 need be reduced.

Further, when the light receiving output of the density sensor 80 exceeds the lower limit V11 and is below the upper limit V21, in the detection circuit section 30, the output of the comparator 33 is at an "H" level while the output of the comparator 34 is at an "L" level. Thus, the OUT1 and the OUT2 are both at an "H" level.

Accordingly, when the OUT1 and the OUT2 are both at an "H" level, it is sufficient that the light emission driving current of the light emitting element 801 is maintained at the present value.

From this point of view, the light intensity adjustment control operation performed by the light intensity adjustment control section 168 of the image forming apparatus 10C according to the exemplary embodiment is described below with reference to a flowchart shown in FIG. 20.

Figure 20:
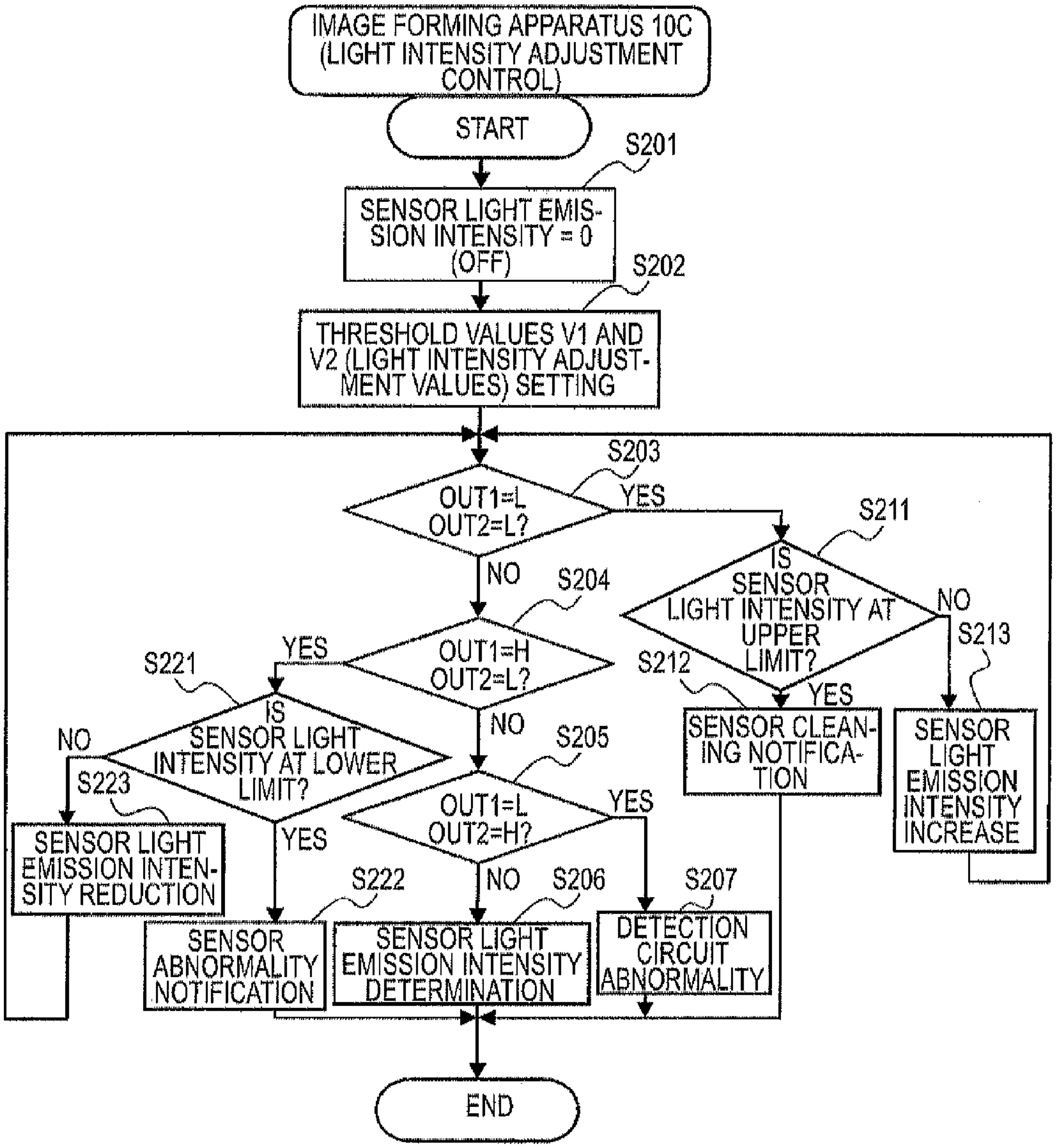
FIG. 20 is a flowchart showing light intensity adjustment control operation in a light intensity adjustment control section according to the third exemplary embodiment.

As shown in FIG. 20, when the light intensity correction mode described above is started, the light intensity adjustment control section 168 controls the light emitting element 801 of the density sensor 80 into an OFF state (a state that the light emission driving current is "0") (step S201), and then sets up the threshold values V11 and V21 serving as light intensity adjustment values into the two comparators 33 and 34 in the detection circuit section 30 (see FIG. 4) of the image density/position detecting section 165 (step S202).

In this setting processing, the input digital signal to the comparator 33 is adjusted so that an analog signal corresponding to the threshold value V11 is outputted. On the other hand, the input digital signal to the comparator 34 is adjusted so that an analog signal corresponding to the threshold value V21 is outputted.

After the setting of the threshold values V11 and V21 at step S202 has been completed, the light intensity adjustment control section 168 controls the emitted light intensity (light emission driving current) of the light emitting element 801 of the density sensor 80 to be increased gradually so as to increase the emitted light intensity, and then checks the output levels OUT1 and OUT2 outputted from the detection circuit section 30 in accordance with the comparison result of the light receiving output with the threshold values V11 and V21 having been set up respectively in the above-mentioned comparators 33 and 34 that acquire the light receiving output of the light receiving element 802 at the time, so as to determine whether the OUT1 and the OUT2 are both at an "L" level (step S203).

Here, when the OUT1 and the OUT2 are both at an "L" level (step S203: YES), it is checked whether the light emission driving current reaches the upper limit (step S211). When the upper limit is not reached (step S211: NO), control is performed such that the emitted light intensity (light emission driving current) of the light emitting element 801 is increased (step S213).

After that, at step S203, it is determined that the OUT1 and the OUT2 are both at an "L" level (step S203: YES) and hence the light emission driving current does not reach the upper limit (step S211: NO), increasing control for the emitted light intensity (light emission driving current) is continued (step S213).

During this time, when it is determined that the OUT1 and the OUT2 are both at an "L" level (step S203: YES) and then it is determined that the light emission driving current reaches the upper limit (step S211: YES), a possibility is expected that the emitted light intensity and the received light intensity are reduced by dirt or the like in the density sensor 80. Thus, notification of requesting sensor cleaning by the user is performed, for example, by a method of displaying an appropriate message on the display section of the display/operation section 15 (step S212). Then, the light intensity correction control is terminated.

In contrast, during the increasing control for the emitted light intensity at the above-mentioned step S213, when it is determined that the OUT1 and the OUT2 are both not at an "L" level (step S203: NO), the light intensity adjustment control section 168 determines whether the OUT1 is at an "H" level and the OUT2 is at an "L" level (step S204).

Here, when it is determined that the OUT1 is at an "H" level and the OUT2 is at an "L" level (step S204: YES), it is checked whether the light emission driving current reaches the lower limit (step S221). When the lower limit is not reached (step S221: NO), control is performed such that the emitted light intensity (light emission driving current) of the light emitting element 801 is increased (step S223).

After that, when it is determined at step S203 that the OUT1 and the OUT2 are both not at an "L" level (step S203: YES), then it is determined at step S204 that the OUT1 is at an "H" level and the OUT2 is at an "L" level (step S204: YES), and then the light emission driving current does not reach the lower limit (step S221: NO), reducing control for the emitted light intensity (light emission driving current) is continued (step S213).

During this time, when it is determined at step S203 that the OUT1 and the OUT2 are both not at an "L" level (step S203: YES), then it is determined at step S204 that the OUT1 is at an "H" level and the OUT2 is at an "L" level (step S204: YES), and then it is determined that the light emission driving current reaches the lower limit (step S221: YES), a possibility of abnormality in the density sensor 80 is expected. Thus, the sensor abnormality is notified to the user, for example, by a method of displaying an appropriate message on the display section of the display/operation section 15 (step S222). Then, the light intensity correction control is terminated.

Further, at the above-mentioned step S204, when the situation that the OUT1 is at an "H" level and that the OUT2 is at an "L" level is denied (step S204: NO), the light intensity adjustment control section 168 determines whether the OUT1 is at an "L" level and the OUT2 is at an "H" level (step S205).

Here, when it is determined that the OUT1 is at an "L" level and the OUT2 is at an "H" level (step S205: YES), this situation is not ordinary. Thus, it is determined that the detection circuit section 30 is abnormal. Thus, the abnormality in the detection circuit is notified to the user, for example, by a method of displaying an appropriate message on the display section of the display/operation section 15 (step S207). Then, the light intensity correction control is terminated.

In contrast, when the situation that the OUT1 is at an "L" level and that the OUT2 is at an "H" level is denied (step S205: NO), the light receiving output of the light emitting element 802 has a value between the threshold values V11 and V21. Thus, it is determined that the light emission driving current at that time is an appropriate emitted light intensity (step S206). Then, the light intensity correction control is terminated.

After that, in the density measurement processing at step S103 during the density/color deviation correction control shown in FIG. 5, the light intensity adjustment control section 168 drives the light emission of the light emitting element 801 of the density sensor 80 by the light emission driving current determined at the above-mentioned step S206. Further, in the image density/position detecting section 165, the light receiving output (density detection output Vout) of the light receiving element 802 of the density sensor 80 at that time is acquired into the two comparators 33 and 34 in the detection circuit section 30 (see FIG. 4) of the image density/position detecting section 165 so that density and position detection processing is performed on each correction patch P.

The light intensity correction control function according to the exemplary embodiment has been described for an example of application to the image forming apparatus 10 according to the first exemplary embodiment provided with the detection circuit section 30 shown in FIG. 4. However, this function may be applied to the image forming apparatus 10B according to the second exemplary embodiment provided with the similar detection circuit section 30 (see FIG. 14).

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

For example, in the above-mentioned exemplary embodiments 1 and 2, as shown in FIGS. 4 and 14, the density/color deviation correction control section 162 has been described for a case that the image density/position detecting section 165 or 165*b* performs the density and position detection for the correction patch P by using the detection circuit section 30 having the D/A converters 31 and 32, the comparators 33 and 34, the inverting circuit 35, and the AND circuit 36. However, the configuration is not limited thereto. That is, an image density/position detecting section (designated by 165*d* for simplicity) may be employed that has: a comparator (designated by 33*d* for simplicity) to which the density detection output of the density sensor 80 and a predetermined threshold value (e.g., V1) are inputted as comparison targets; and a timer (designated by 44 for simplicity) for counting the time length of the comparator 33*d* output.

In this configuration, the comparator 33*d* of the image density/position detecting section 165*d* generates an output as shown in FIG. 9(*a*) [an output equivalent to that of the comparator 33 according to the exemplary embodiments 1 and 2] in which when the density detection output Vout of the density sensor 80 reaches the threshold value V1 at the time of fall, an "H" level is outputted and in which when the density detection output returns to the threshold value V1 at the time of rise, an "L" level is outputted.

Here, according to the output characteristics of the density detection output Vout of the density sensor 80 described above with reference to FIG. 8, the interval length of the "H" level of the output of the comparator 33*d* described above corresponds to the density of the correction patch P serving as a detection target. Specifically, a higher density causes a longer interval, while a lower density causes a shorter interval.

Thus, in the image density/position detecting section 165*d*, the timer 44 counts the time length of the "H" level of the output from the above-mentioned comparator 33*d*. Then, the density of the correction patch P can be detected on the basis of the time length counted by the timer 44 (the time length elapsing in the course that the comparator 33*d* output transits to an "H" level at the time of fall of the detection output of the density sensor 80 and then transits to an "L" level at the time of rise; the time width elapsing when the output is at or exceeding the threshold value V1 in the course from the time of fall to the time of rise).

Further, in the image density/position detecting section 165*d*, on the basis of the time length of the "H" level of the output from the comparator 33*d* counted by the timer 44, the center time of the time length is calculated similarly to the first and second exemplary embodiments, so that the position of the correction patch P serving as a detection target can be detected.

Further, the above-mentioned embodiments have been described for a case that the toner image of each color formed by each image forming unit 50 is transferred onto the image carrying body and then the toner image of each color carried on the image carrying body is transferred further onto a printing sheet so that a color image is formed. However, the present invention may be applied to an image forming apparatus in which the toner image of each color formed by each image forming unit 50 is transferred directly onto a printing sheet conveyed by the conveyance belt. In this case, the density correction patch and the correction patch may be formed on the above-mentioned conveyance belt and then density correction and color deviation correction may be performed.

The exemplary embodiments of the invention are applicable to a tandem-type color image forming apparatus, such as a printer or a multi function device, that requires image density correction and color deviation correction.

What is claimed is:

1. An image forming apparatus comprising:

a plurality of image forming sections that forms images of different colors, respectively;

a correction image formation controlling section that forms correction images, for density correction and color deviation correction, of the respective colors, by causing the image forming sections to draw the correction images and transferring the correction images onto an image carrying body;

a density sensor that detects a density of each of the correction images in synchronization with passage of each of the correction images on the image carrying body;

a detecting section that detects a position and the density of each of the correction images, based on a binary signal of a density detection output of each of the correction images;

a density correction controlling section that corrects and controls a density of an image of a color whose density is abnormal, based on the detected density of each of the correction images; and a color deviation correction controlling section that corrects and controls a color deviation of an image of a color in which color deviation occurs, based on the detected position of each of the correction images, wherein the detecting section compares the density detection output of the density sensor with a first threshold value and a second threshold value, the first threshold value being larger than the second threshold value, the density detection output has characteristics of falling at the time of passage of a leading edge part of the correction images and rising at the time of passage of a rear edge part of the correction images, the detecting section detects the density of each of the correction images, based on (i) a width of time during which the density detection output varies from the first threshold value to the second threshold value at the time of falling or (ii) a width of time during which the density detection output varies from the second threshold value to the first threshold value at the time of rising, and the detecting section detects the position of each of the correction images, based on a width of time when the density detection output is at or exceeds the first threshold value from the time of falling to the time of rising.

2. An image forming apparatus comprising:

a plurality of image forming sections that forms images of different colors, respectively;

a correction image formation controlling section that forms correction images, for density correction and color deviation correction, of the respective colors, by causing the image forming sections to draw the correction images and transferring the correction images onto an image carrying body;

a density sensor that detects a density of each of the correction images in synchronization with passage of each of the correction images on the image carrying body;

a detecting section that detects a position and the density of each of the correction images, based on a binary signal of a density detection output of each of the correction images;

a density correction controlling section that corrects and controls a density of an image of a color whose density is abnormal, based on the detected density of each of the correction images; and a color deviation correction controlling section that corrects and controls a color deviation of an image of a color in which color deviation occurs, based on the detected position of each of the correction images, wherein the detecting section compares the density detection output of the density sensor with a first threshold value and a second threshold value, the first threshold value being larger than the second threshold value, the density detection output has characteristics of falling at the time of passage of a leading edge part of the correction images and rising at the time of passage of a rear edge part of the correction images, the detecting section detects the density of each of the correction images, based on (i) a width of time during which the density detection output varies from the first threshold value to the second threshold value at the time of falling or (ii) a width of time during which the density detection output varies from the second threshold value to the first threshold value at the time of rising, and the detecting section detects the position of each of the correction images, based on a width of time between a leading edge of the time during which the density detection output varies from the first threshold value to the second threshold value at the time of falling and a rear edge of the time during which the density detection output varies from the second threshold value to the first threshold value at the time of rising.

3. The image forming apparatus according to claim 1, further comprising:

a change setting section that changes and sets at least one of the first threshold value and the second threshold value, when the density detection output does not reach the first threshold value or the second threshold value; and a re-detection controlling section that causes the detecting section to detect again the density and the position of each of the correction images, after the change setting section changes and sets the at least one of the first threshold value and the second threshold value.

4. The image forming apparatus according to claim 2, further comprising:

a change setting section that changes and sets at least one of the first threshold value and the second threshold value, when the density detection output does not reach the first threshold value or the second threshold value; and a re-detection controlling section that causes the detecting section to detect again the density and the position of each of the correction images, after the change setting section changes and sets the at least one of the first threshold value and the second threshold value.

5. The image forming apparatus according to claim 3, further comprising:

a counting section that counts the number of times of change of the at least one of the first threshold value and the second threshold value, wherein when the number of times of change is less than a given number of times, the density correction controlling section corrects the density of the color in which the density detection output does not reach the first threshold value or the second threshold value.

6. The image forming apparatus according to claim 4, further comprising:

a counting section that counts the number of times of change of the at least one of the first threshold value and the second threshold value, wherein when the number of times of change is less than a given number of times, the density correction controlling section corrects the density of the color in which the density detection output does not reach the first threshold value or the second threshold value.

7. The image forming apparatus according to claim 5, further comprising:

a notifying section that notifies a density abnormality of the color in which the density detection output does not reach the first threshold value or the second threshold value, when the number of times of change reaches the given number of times.

8. The image forming apparatus according to claim 6, further comprising:

a notifying section that notifies a density abnormality of the color in which the density detection output does not reach the first threshold value or the second threshold value, when the number of times of change reaches the given number of times.

9. The image forming apparatus according to claim 1, further comprising:

a light intensity adjustment control threshold setting section that sets third and fourth threshold values for light intensity adjustment control, instead of the first and second threshold values, at timing when a roughened surface of the image carrying body in which the correction image is not formed passes a density detection position of the density sensor, wherein the fourth threshold value is larger than the third threshold value, and the density sensor comprises a light emitting element and a light receiving element; and a light intensity adjustment controlling section that (i) controls light emission of the light emitting element in synchronization with the passage of the roughened surface of the image carrying body, (ii) acquires a light receiving output, from the light receiving element, of light reflected from the roughened surface of the image carrying body, as the density detection output of the density sensor, (iii) compares the light receiving output with the third threshold value and the fourth threshold value, and (iv) adjusts and controls light intensity of the light emitting element such that the light receiving output is in a range of the third threshold value to the fourth threshold value.

10. The image forming apparatus according to claim 2, further comprising:

a light intensity adjustment control threshold setting section that sets third and fourth threshold values for light intensity adjustment control, instead of the first and second threshold values, at timing when a roughened surface of the image carrying body in which the correction image is not formed passes a density detection position of the density sensor, wherein the fourth threshold value is larger than the third threshold value, and the density sensor comprises a light emitting element and a light receiving element; and a light intensity adjustment controlling section that (i) controls light emission of the light emitting element in synchronization with the passage of the roughened surface of the image carrying body, (ii) acquires a light receiving output, from the light receiving element, of light reflected from the roughened surface of the image carrying body, as the density detection output of the density sensor, (iii) compares the light receiving output with the third threshold value and the fourth threshold value, and (iv) adjusts and controls light intensity of the light emitting element such that the light receiving output is in a range of the third threshold value to the fourth threshold value.

11. An image forming apparatus comprising:

a plurality of image forming sections that forms images of different colors, respectively;

a correction image formation controlling section that forms correction images, for density correction and color deviation correction, of the respective colors, by causing the image forming sections to draw the correction images and transferring the correction images onto an image carrying body;

a density sensor that detects a density of each of the correction images in synchronization with passage of each of the correction images on the image carrying body;

a detecting section that detects a position and the density of each of the correction images, based on a binary signal of a density detection output of each of the correction images;

a density correction controlling section that corrects and controls a density of an image of a color whose density is abnormal, based on the detected density of each of the correction images; and a color deviation correction controlling section that corrects and controls a color deviation of an image of a color in which color deviation occurs, based on the detected position of each of the correction images, wherein the detecting section compares the density detection output of the density sensor with a given threshold value, the density detection output has characteristics of falling at the time of passage of a leading edge part of the correction images and rising at the time of passage of a rear edge part of the correction images, the detecting section detects the density of each of the correction images, based on a width of time during which the density detection output is at or exceeds the given threshold value from the time of falling to the time of rising, and the detecting section detects the position of each of the correction images from a center of the width of the time during which the density detection output is at or exceeds the given threshold value from the time of falling to the time of rising.

* * * * *